(12) United States Patent
Swoboda

(10) Patent No.: US 7,992,065 B2
(45) Date of Patent: Aug. 2, 2011

(54) AUTOMATIC SCAN FORMAT SELECTION BASED ON SCAN TOPOLOGY SELECTION

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 240 days.

(21) Appl. No.: 12/511,998

(22) Filed: Jul. 29, 2009

(65) Prior Publication Data

US 2010/0031104 A1    Feb. 4, 2010

Related U.S. Application Data

(60) Provisional application No. 61/084,474, filed on Jul. 29, 2008, provisional application No. 61/084,471, filed on Jul. 29, 2008, provisional application No. 61/084,463, filed on Jul. 29, 2008, provisional application No. 61/084,458, filed on Jul. 29, 2008, provisional application No. 61/084,453, filed on Jul. 29, 2008, provisional application No. 61/084,439, filed on Jul. 29, 2008.

(51) Int. Cl.
*G01R 31/28*    (2006.01)

(52) U.S. Cl. .......................................... 714/727; 714/729
(58) Field of Classification Search .................. 714/726, 714/731, 727, 729; 702/150; 370/352
See application file for complete search history.

(56) References Cited

U.S. PATENT DOCUMENTS

| 5,606,566 | A  | * | 2/1997  | Whetsel ......................... 714/729 |
| 6,311,302 | B1 | * | 10/2001 | Cassetti et al. ................. 714/727 |
| 6,587,981 | B1 | * | 7/2003  | Muradali et al. ............... 714/726 |
| 6,658,614 | B1 | * | 12/2003 | Nagoya ......................... 714/727 |
| 6,925,410 | B2 | * | 8/2005  | Narayanan .................... 702/150 |
| 7,675,900 | B1 | * | 3/2010  | Parham et al. ................. 370/352 |
| 7,725,790 | B2 | * | 5/2010  | Whetsel ......................... 714/726 |
| 7,877,651 | B2 | * | 1/2011  | Whetsel ......................... 714/726 |

* cited by examiner

*Primary Examiner* — David Ton
(74) *Attorney, Agent, or Firm* — Robert D. Marshall, Jr.; W. James Brady; Frederick J. Telecky, Jr.

(57) ABSTRACT

A method for specifying a signaling protocol to be used by a controller in a group of controllers connected with shared signaling is provided in which the controller is selected based on selection criteria received by the controller and the signaling protocol is specified based on the received selection criteria.

29 Claims, 20 Drawing Sheets

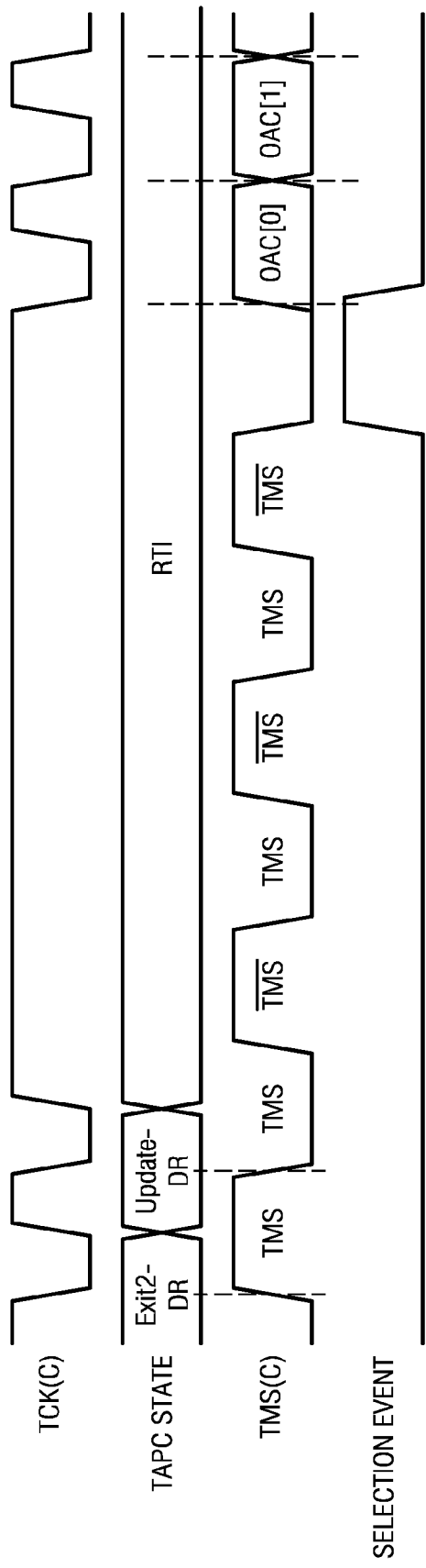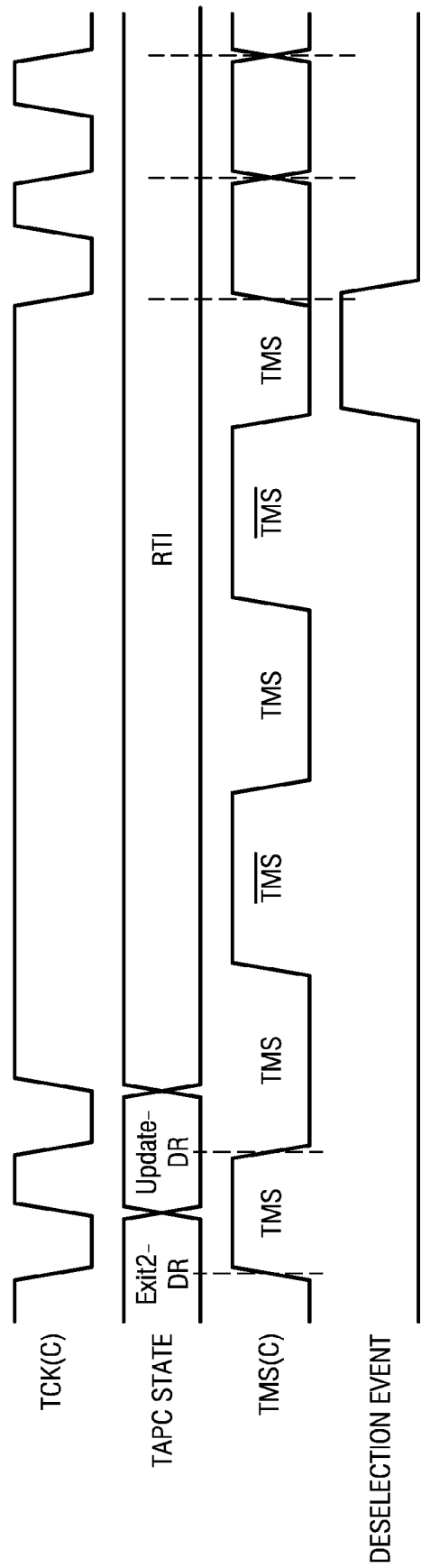

AUTOMATIC SCAN FORMAT SELECTION BASED ON SCAN TOPOLOGY SELECTION

CLAIM OF PRIORITY

The present application claims priority to and incorporates by reference U.S. Provisional Application No. 61/084,474 filed Jul. 29, 2008, entitled "Topology Discovery Training." The present application also claims priority to and incorporates by reference U.S. Provisional Application No. 61/084,471 filed Jul. 29, 2008, entitled "Series Equivalent Scans Across Multiple Scan Topologies." The present application also claims priority to and incorporates by reference U.S. Provisional Application No. 61/084,463 filed Jul. 29, 2008, entitled "Selecting a Scan Topology." The present application also claims priority to and incorporates by reference U.S. Provisional Application No. 61/084,458 filed Jul. 29, 2008, entitled "Automatic Scan Format Selection Based on Scan Topology Selection." The present application also claims priority to and incorporates by reference U.S. Provisional Application No. 61/084,453 filed Jul. 29, 2008, entitled "Dynamic Broadcast of Configuration Loads Supporting Multiple Transfer Formats." The present application also claims priority to and incorporates by reference U.S. Provisional Application No. 61/084,439 filed Jul. 29, 2008, entitled "Timing Protected Detection of Alternate Signaling Mechanism Using Clock and Data."

FIELD OF THE INVENTION

This invention generally relates to the field of testing integrated circuits and systems containing integrated circuits.

BACKGROUND OF THE INVENTION

The IEEE 1149.1 standard was adopted in 1990. Built upon the work of the Joint Test Action Group (JTAG), it provided a pins-out view from one IC pad to another to help test engineers locate and discover faulty PC boards. A description of the boundary scan description language was added in 1994.

Complications arose as chips increased functionality and designs shifted away from PC boards to multichip modules and stacked die packages. These difficulties included handling the pin count requirements and multiple Test Access Port (TAP) controllers for System-on-Chip (SoC) devices, testing multichip modules and stacked die configurations, enhancing debug performance, and improving test and debug logic power-down in low-power conditions.

Organizations like the Mobile Industry Processor Interface Alliance and the NEXUS 5001 Forum took up the challenge to solve the problems specific to their industries.

BRIEF DESCRIPTION OF THE DRAWINGS

Particular embodiments in accordance with the invention will now be described, by way of example only, and with reference to the accompanying drawings:

FIGS. 16A and 16B are timing diagrams illustrating selection and deselection, respectively, with the standard protocol;

DETAILED DESCRIPTION OF EMBODIMENTS OF THE INVENTION

As chips add new functionality and system designs evolve away from boards and toward multi-chip system-on-chip (SoC) architectures, developers of handheld and consumer electronics are faced with stricter pin and package constraints. The IEEE 1149.7 standard is a new two-pin test and debug interface standard that supports half the number of pins of the IEEE 1149.1 technology, allowing developers to easily test and debug products with complex digital circuitry, multiple CPUs and applications software in products such as mobile and handheld communication devices.

Systems and integrated circuits that utilize IEEE 1149.7 may be designed to include a complex scan topology. Circuits and methods for selecting the scan topology during a test session will be described in more detail below.

The IEEE 1149.7 is a complementary superset of the widely adopted IEEE 1149.1 (JTAG) standard that has been in use for more than two decades. This standard defines a port into embedded systems for device manufacturing, testing and software development during system development. In addition to maintaining compatibility with IEEE 1149.1, the new standard improves debug capabilities and reduces SoC pin-count requirements. It also standardizes power-saving conditions, simplifies manufacturing of multi-chip modules and stacked die devices, and provides the ability to transport instrumentation data. Concepts and terminology used in IEEE 1149.1 and in IEEE 1149.7 are used in a similar manner herein and are therefore not described in detail herein.

Rather than replacing IEEE 1149.1, the new IEEE 1149.7 standard expands its functionality while reducing the number of pins used in some configurations. It supports new scan topologies that are favorable to stacked die and multichip module configurations and offers advanced capabilities to aid in software debug. It describes circuitry that may be added to an integrated circuit to provide access to on-chip IEEE standard test access ports (TAPs) specified by IEEE Std 1149.1-2001. It provides complete backward compatibility with the 1149.1 standard while aggressively adding features to supporting applications test and debug. The circuitry uses IEEE Standard 1149.1-2001 as its foundation.

The 1149.7 Standard delivers these capabilities with six classes of test access ports (T0-T5), with each class providing incremental capability. The IEEE 1149.7 standard has two groups of capabilities: Classes T0 through T3, which extend IEEE 1149.1 and enable new operations using the IEEE 1149.1 protocol, and Classes T4 and T5, which are focused on advanced two-pin operation using an Advanced Protocol.

Figure 1:
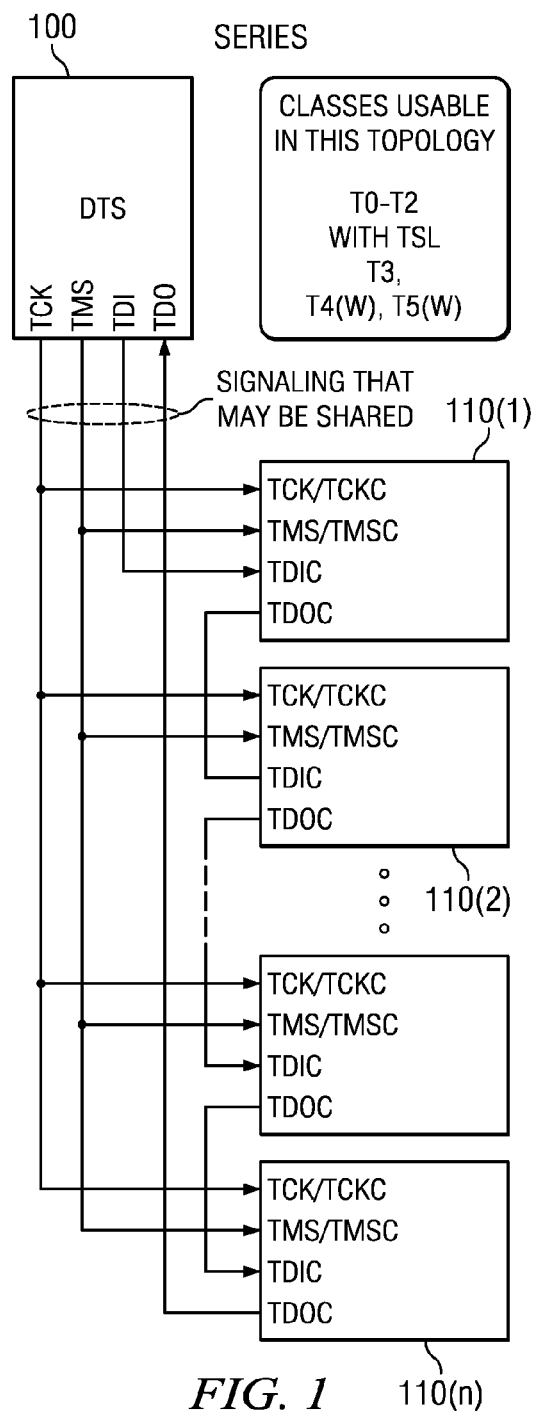
FIG. 1 is a block diagram illustrating a target system with series scan topology.

Class T0 ensures compliance with the industry's test infrastructure by setting up IEEE 1149.7 devices to make them act compatibly with IEEE 1149.1. These techniques include the use of N-bit IR, 1-bit DR for bypass instruction, mandatory IDCODE (32-bit path), and mandatory instructions behaving as specified in the IEEE 1149.1 specification. After a test logic reset is initiated, all multi-TAP devices must conform to the mandatory IEEE 1149.1 instruction behavior and implement a 1-bit DR scan for the bypass instruction. FIG. 1 illustrates such a system. Debug test system (DTS) 100 is generally a computer based system that provides control and a user interface for testing an integrated chip, printed circuit board or SoC using IEEE 1149.1 that has been enhanced to support the IEEE 1149.7 protocols. DTS 100 may be an XDS emulator from Texas Instruments, for example. Modules 110(1)-110(n) are representative of various modules that may be interconnected to DTS 100 using various aspects that will be described in more detail below.

Class T1 instantiates a control system for the IEEE 1149.7 standard that is transparent to IEEE 1149.1 devices, providing a foundation for the advanced functionality implemented in Classes T1 through T5 without changing the IEEE 1149.1 state machine. It supports standardized test and functional resets along with power management of the TAP controller and test logic.

Figure 2:
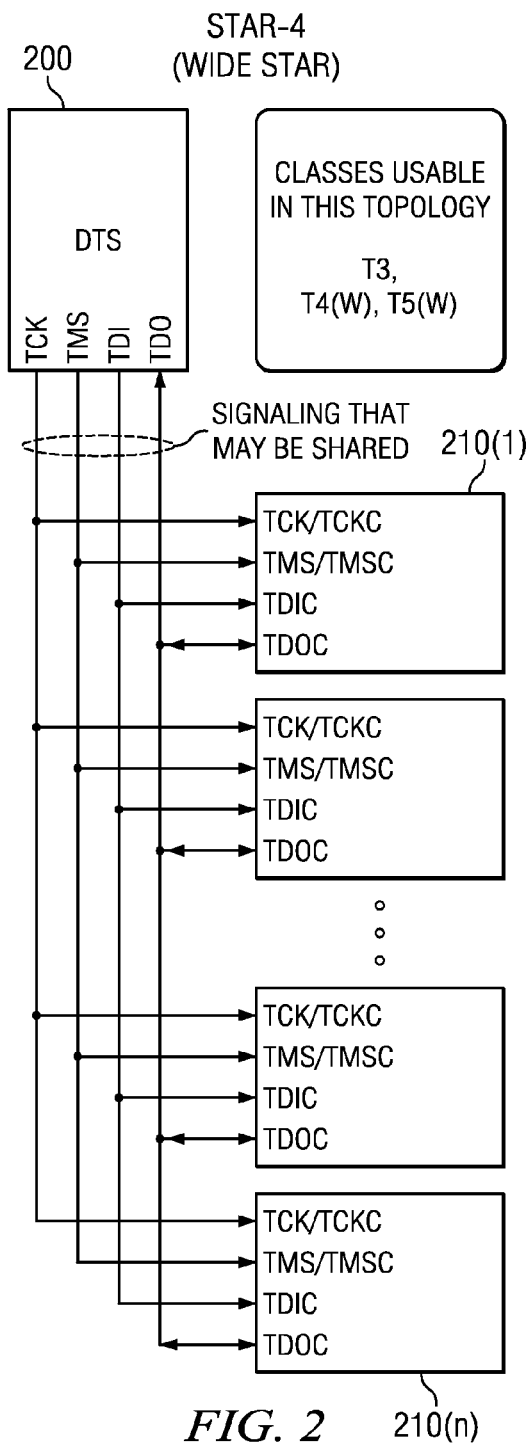
FIG. 2 is a block diagram illustrating a target system with four-wire star scan topology.

Class T2 offers a chip-level bypass mechanism that shortens scan paths and another mechanism that provides hot connect capability to achieve higher performance for testing high chip count applications, Class T3 provides for boundary scan testing using a four signal star topology (Star-4), with TAP selection built into the TAP.7 controller, unlike the use of a Star-4 Scan Topology described by the IEEE 1149.1 Standard. A T3 TAP may be deployed in either a series or star scan topology. A star topology is preferable for testing stacked die configurations. Whereas FIG. 1 shows the series scan topology, FIG. 2 illustrates the Star-4 or Wide Star configuration. In this case, modules 210(1)-210(n) are connected in a parallel manner using four wires and may be connected to DTS 200 that is configured to provide control over a star connected system, as will be described in more detail below. Direct addressability is included with T3 and above TAP.7 controllers.

Class T4 provides a reduction of number of test and debug pins in SoC devices. It supports scan transactions with two pins instead of four, resulting in fewer total pins required on chip packages. This also helps with stacked die configurations because it is highly desirable to have debug pins connected in parallel when dies are stacked. Two-pin operation is provided by eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

To address the rising number of pins in SoC devices, Class T4 adds scan formats to support transactions with two pins instead of four, resulting in fewer total pins required on chip packages. This also helps with stacked die configurations because it is highly desirable to have the fewest number of connectors possible when die are stacked. The key to two-pin operation is eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

Besides reducing pin count, Class T4 defines optimized download-specific scan modes in which only useful information is downloaded. To improve pin operation performance, the clock rate also can be doubled. These features combined with the optimized transactions do not cause performance loss, instead improving performance in some cases.

Class T5 functionality is beneficial primarily to software designers utilizing a Test Access Port for debugging. This class gives the test port the ability to perform debug and instrumentation operations concurrently (data is transferred during idle time), which reduces the number of pins dedicated to instrumentation, and enables custom protocols to use the pins, a feature many vendors offer in nonstandard ways. Class T5 standardizes the process used to access the pins and provides both scan and data transport transactions using the two wire interface.

Figure 3:
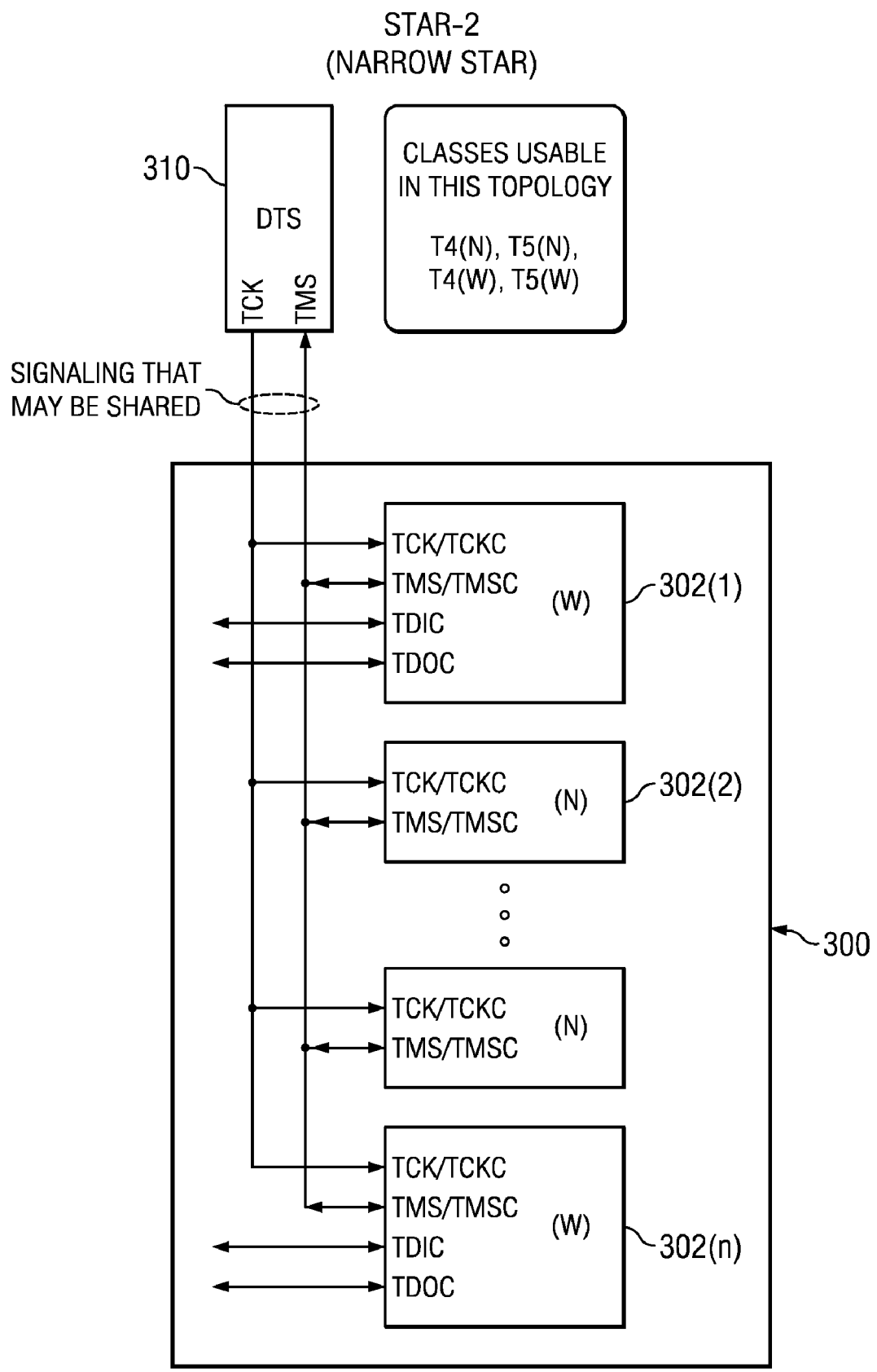
FIG. 3 is a block diagram illustrating a target system with two-wire star scan topology.

FIG. 3 also illustrates a debug test system (DTS) 310 coupled to SoC 300. DTS 310 is generally a computer based system that provides control and a user interface for testing an integrated chip, printed circuit board or SoC using IEEE 1147.1 that has been enhanced to support the IEEE 1147 protocols and two-wire interface, as will be described in more detail below. DTS 310 may be an XDS emulator from Texas Instruments, for example.

T0-T3, and T4/T5 four pin TAP.7s may be deployed in a Series Scan topology. T3 and T4/T5 four pin TAP.7s may be deployed in a Star-4 Scan topology. T4-T5 TAP.7s may be deployed in a Star-2 Scan Topology. When deployed in these scan topologies, all classes can traverse the state diagram using a common protocol (Standard—the legacy IEEE 1149.1 protocol). In the Series Scan Topologies data transfers to conventional 1149.1 instruction and data registers are performed with the Standard Protocol. In the Star-4 scan topology data transfers are performed with the Standard Protocol modified to prevent drive conflicts, with the ability to select the scan paths of only one TAP.7 controller in the topology at a time. This provides for sequential access to the paths of each TAP.7 controller in the branch. In the Star-2 scan topology, data transfers are performed only with the Advanced Protocol. The selection mechanisms for scan paths and TAPCs available with Star-4 operation are also available with Star-2 operation. Classes T0-T2 allow the use only the Standard Protocol, Class T3 allows the use of the Standard Protocol to traverse the TAPC state diagram and a modified Standard Protocol to either traverse the state diagram or perform data transfers in the Shift-IR and Shift-DR states. Classes T4 and T5 allow the use of the Standard Protocol to traverse the TAPC state diagram, a modified Standard Protocol to either traverse the state diagram or perform data transfers in the Shift-IR and Shift-DR states, when operated in a Star-4 Scan Topology, and Advanced Protocols to either traverse the state diagram or perform data transfers in the Shift-IR and Shift-DR states when operated in a Star-2 Scan Topology. It is important to note that with deployment in Star-4 and Star-2 topologies, TAP.7 controllers perform data transfers in these scan topologies using protocols unique to the topology in which they are deployed.

With Series Equivalent Scans, the selection of a single branch initiates the use of the protocol required to transfer data, while the selection of all branches initiates the use of the Standard Protocol since only traversing the state diagram is needed.

The operation of each of these Scan Topology Branches supports the selection of individual TAPCs and the scan paths associated with them during their independent operation. This is covered in the 1149.7 standard and not in this description.

TAP.7 architecture provides for the operation of Series, Star-4, and Star-2, Scan Topologies and other technologies sharing the TCK(C), TMS(C), TDI(C), and TDO(C) connections to a Debug Test System directing scan activity. These Scan Topologies are called branches of the system scan topology. With this architecture, an Adapter Test Access Port Controller (ADTAPC) is the gateway to scan facilities of a chip implementing an 1149.7 Test Access Port. The ADTAPC controls access to a Chip-Level Test Access Port Controller (CLTAPC) that provides access to chip-level scan paths Since a typical boundary scan operation requires scanning the instruction registers and boundary scan cells of one or more devices between the Select-xR and Update-xR states, a method is needed to duplicate the scan transaction available with a Series Scan topology when more than one scan topology is involved. With this description, states such as the Capture-xR and Update-xR TAP are to be interpreted as follows: the "x" refers to either "D" for data or "I" for instruction. Embodiments of the invention provide this equivalent function, a series equivalent scan.

Series equivalent scans of a complex scan topology, i.e., a scan topology with two or more branches in which at least two of the branches are of differing technologies (see Table 1), sharing the same control and data signaling create the equivalent of an 1149.1 series scan that begins with the Select-xR state and ends with the Update-xR state. With a series Scan Topology, all scan paths of interest are scanned at the same time between these states. With a complex scan topology, this is not possible as methods used to transfer data to and from scan paths presented by Series, Star-2, and Star-4 Scan Topologies and other technologies is different.

With series equivalent scans, a scan is broken into sections consisting of one or more scan sections. With an 1149.7 Test Access Port, the scan section is one or more sequences of the Exit2-xR, one or more Shift-xR states, Exit1-xR, and one or more Pause-xR states. With another technology, scan data is delivered as defined by the technology. These scan sections are sandwiched between a preamble (Select-xR, Capture-xR, Exit1-xR, and one or more Pause-DR states) and a postamble (Exit2-xR and Update-DR states). A single branch is selected between the preamble and the first scan section and between scan sections. All branches are selected between the last scan section and the postamble. With the sequence described above, all or some CLTAPCs in all branches progress from either the Test-Logic-Reset or Pause-xR state to the Pause-xR state without encountering an Shift-xR state. The TAPCs of all branches of interest operate in lockstep during the preamble and postamble state sequences, with only the TAPCs within branches that are selected during scan sections.

TABLE 1

Protocol usage by Technology

| TAPC State | Protocol | Topology Selected | Operation of Branches | | | |
|---|---|---|---|---|---|---|
| | | | Series | Star-4 | Star-2 | Other |
| Select-xR | Standard | All | Active | Active | Active | Active |
| Capture-xR | Standard | All | Active | Active | Active | Active |
| Exit1-xR | Standard | All | Active | Active | Active | Active |
| Pause-xR | Standard | All | Active | Active | Active | Active |
| — | — | — | Select-Series. | | | |
| Pause-xR | Standard | Series | Active | Dormant | Dormant | Dormant |
| Exit2-xR | Standard | Series | Active | Dormant | Dormant | Dormant |
| Shift-xR | Standard | Series | Active | Dormant | Dormant | Dormant |
| Shift-xR | Standard | Series | Active | Dormant | Dormant | Dormant |
| Exit1-xR | Standard | Series | Active | Dormant | Dormant | Dormant |
| Pause-xR | Standard | Series | Active | Dormant | Dormant | Dormant |
| — | — | — | Select-Star-2 | | | |
| Pause-xR | Advanced | Star-2 | Dormant | Dormant | Active | Dormant |
| Exit2-xR | Advanced | Star-2 | Dormant | Dormant | Active | Dormant |
| Shift-xR | Advanced | Star-2 | Dormant | Dormant | Active | Dormant |

TABLE 1-continued

Protocol usage by Technology

| TAPC State | Protocol | Topology Selected | Series | Star-4 | Star-2 | Other |
|---|---|---|---|---|---|---|
| Shift-xR | Advanced | Star-2 | Dormant | Dormant | Active | Dormant |
| Exit1-xR | Advanced | Star-2 | Dormant | Dormant | Active | Dormant |
| Pause-xR | Advanced | Star-2 | Dormant | Dormant | Active | Dormant |
| — | — | — | | Select-Star-4 | | |
| Pause-xR | Modified Std | Star-4 | Dormant | Active | Dormant | Dormant |
| Exit2-xR | Modified Std | Star-4 | Dormant | Active | Dormant | Dormant |
| Shift-xR | Modified Std | Star-4 | Dormant | Active | Dormant | Dormant |
| Shift-xR | Modified Std | Star-4 | Dormant | Active | Dormant | Dormant |
| Exit1-xR | Modified Std | Star-4 | Dormant | Active | Dormant | Dormant |
| Pause-xR | Modified Std | Star-4 | Dormant | Active | Dormant | Dormant |
| — | — | — | | Select-Other | | |
| Pause-xR | Tech. Defined | Other | Dormant | Dormant | Dormant | Active |
| Exit2-xR | Tech. Defined | Other | Dormant | Dormant | Dormant | Active |
| Shift-xR | Tech. Defined | Other | Dormant | Dormant | Dormant | Active |
| Shift-xR | Tech. Defined | Other | Dormant | Dormant | Dormant | Active |
| Exit1-xR | Tech. Defined | Other | Dormant | Dormant | Dormant | Active |
| Pause-xR | Tech. Defined | Other | Dormant | Dormant | Dormant | Active |
| — | — | — | | Select-All | | |
| Pause-xR | Standard | All | Active | Active | Active | Active |
| Exit2-xR | Standard | All | Active | Active | Active | Active |
| Update-xR | Standard | All | Active | Active | Active | Active |

Table 1 lists various protocols that may be used with a Series Equivalent Scan. A protocol understood by the TAPCs of a selected branch is used to drive the state progression of a scan section. It is not necessary that the TAPCs forming a deselected branch understand the protocol used during this state progression. Scan operations are performed on the selected branch while the other branches remain dormant. Branches that are not selected remain dormant and ignore the protocol being used until they are selected. Once all branches are selected following the last scan section, the TAP controllers forming all branches move through the Update-xR and Capture-xR states in lock step. This provides the function of a series scan.

In summary, a scan of the paths with a branch move the state of the TAPCs forming the branch to Pause-xR, sequentially selecting and scanning the scan paths of interest within each branch beginning and ending the scans in the Pause-xR state. Once these scans are complete, the update/capture operation is performed simultaneously in all TAPCs of all branches of interest The TAPC state may be moved from the Update-xR state to either the Run-Test/Idle state or Select-DR state on to the Pause-xR state where the sequential scans can again be performed. This process preserves the timing between the Update-xR and Capture-DR states when portion of the operation that does not include the Shift-xR state is performed using the Standard Protocol.

The Run-Test-Idle state may also be used to select branches. This capability can be used to select a branch and park the state of one or more of the TAPCs forming the branch. This may be sequentially done for all branches. Only those TAPCs within a branch that are not parked may leave the Run-Test-Idle state. When all branches are selected and the TAPC state moved to the Pause-DR state via the Select-DR state. The TAPCs whose state is parked in Run-Test-Idle state do not participate in the scans.

A Selection Escape Sequence is used to initiate a selection sequence. This sequence can select all ADTAPCs within a branch while deselection all ADTAPCs within other branches or select all ADTAPCs within all branches. A deselection escape sequence deselects all ADTAPCs of all branches. Although selection and deselection escapes can be associated with any ADTAPC state, they are expected to be used while in the Pause-xR and Run-Test-Idle states. This process will be described in more detail below.

DTS/TS Connectivity

The TAP.7 architecture supports both simple and complex system connectivity with a graduated set of capability. A system may deploy any mix of TAP.1s, TAP.7s, and potentially other legacy technologies as shown in FIG. 4, which is a block diagram of a target system with mixed use of technologies and scan topologies.

Most systems will implement only one branch of the connectivity shown in this figure. In most cases, the target system (TS) will only have a limited number of TAPs. Other architectures, represented by branches 406, 407, can also be included as additional branches that are separate from those shown in FIG. 4 in a custom scan topology. These branches are controlled in manner similar to TAP.7 branches.

Technology Branches

Figure 4:
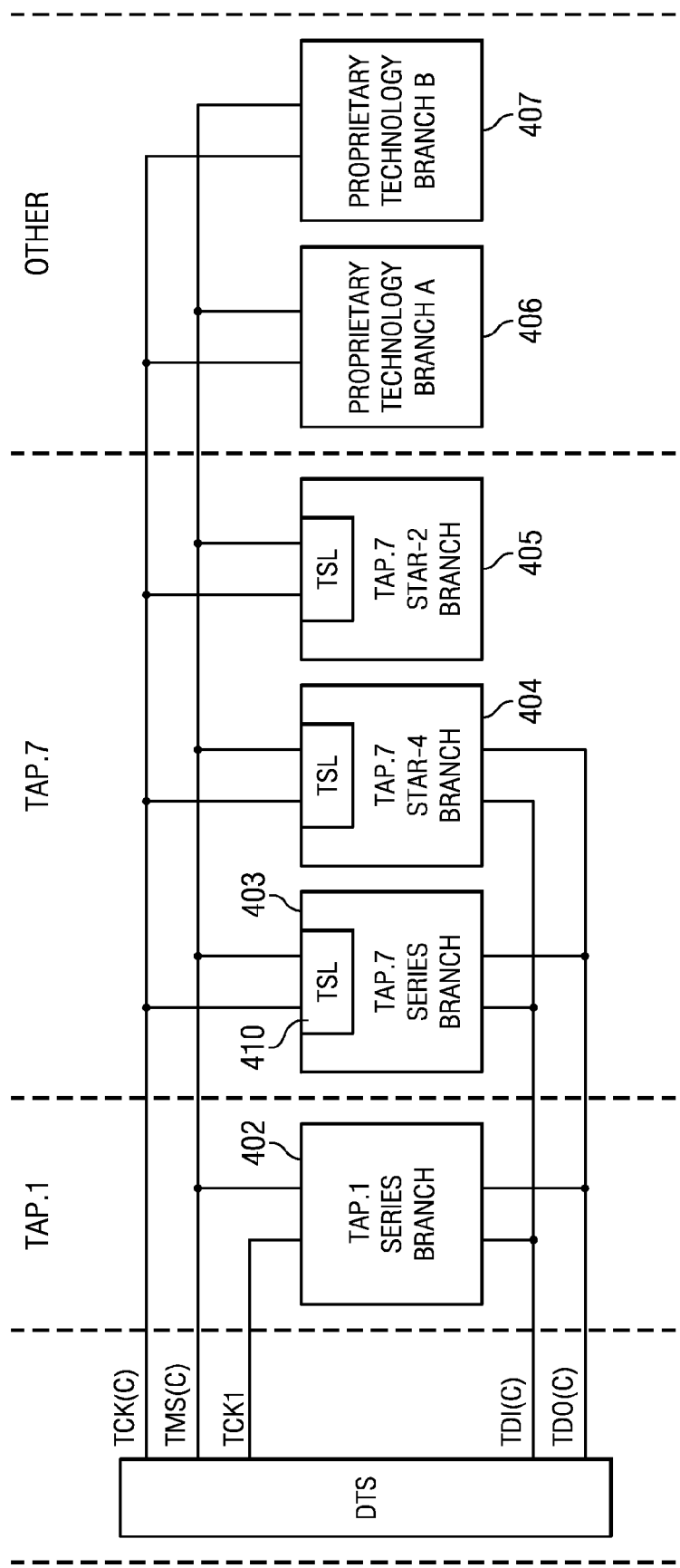
FIG. 4 is a block diagram of a target system with mixed use of technologies and scan topologies.

FIG. 4 is the union of simpler types of connectivity called technology branches. Each of the branches 402-407 shown in this figure may be operated separately for debug purposes. They may also be operated in a manner that provides Series Scan Equivalency across the branches controlled with the TCK1 and TCK(C) signals. Proprietary technologies are generally operated separately but may be operated with TAP.7 controllers in as shown in Table 1. Other embodiments may have various combinations of branch operation.

Other embodiments may have various combinations of branch operation. Other embodiments may use different sets of commands, protocols, events, etc. The list of protocols in Table 1 is not intended to be limiting to embodiments of the invention in any manner.

The TAP.7 branches 403-405 have one or more TAP.7s connected in Series, Star-4, and Star-2 Scan Topologies. These branches contain logic to select or deselect an ADTAPC, indicated generally at 410. This logic provides for the selection and deselection of these branches with Selection and Deselection Escape Sequences. ADTAPC selection logic is optional for T0-T2 TAP.7s and mandatory for T3 and above TAP.7s. Including this logic in T0-T2 TAP.7s supports their deployment in systems where T4(N) and T5(N) TAP.7s may be deployed.

The TAP.1 branch 402 includes a TAP.1 or a T0-T2 TAP.7 without technology selection logic connected in series with other TAP.1s or TAP.7s. It operates with the standard protocol and TAPs with the four 1149.1 signals. This branch is selected using the TCK1 signal shown in this figure as it has no built-in selection mechanism. T0-T2 TAP.7s without selection must be included in a branch that is this type. The ADTAPC selection logic may be added to the current 1149.1 technology to make it selectable using common connectivity.

Proprietary technologies 406, 407 may be connected in parallel with the TAP.7 branches provided: the technology has a dedicated clock and at least one control/data input; the technology implements the technology selection mechanisms and protocols defined by the 1149.7 standard; and the clock pin of the technology is connected to the TCK(C) signal and the control/data pin is connected to the TMS(C) signal.

As noted previously, a TAP.1 branch is selected by keeping its TCK or TMS signal separated from the signal of like name of branches and gating one of the separate signals to deselect the branch. The gating of the TCK signal of this type of branch is used for selecting these types of branches. TAP.1s and T0-T2 TAP.7s without the Technology Selection Logic (TSL) are selected using this method. Any branch may be selected using this method if desired.

TAP.1s and TAP.7s can be deployed in topology branches as shown in Table 2. Each of these topologies is considered a technology within this document.

described by boundary scan description language (BSDL). When there is more than one TAPC per component the 1149.7 test view requires hierarchical scan description language (HSDL), plus BSDL for each endpoint.

TAP.7 Deployment Scenarios

Figure 6:
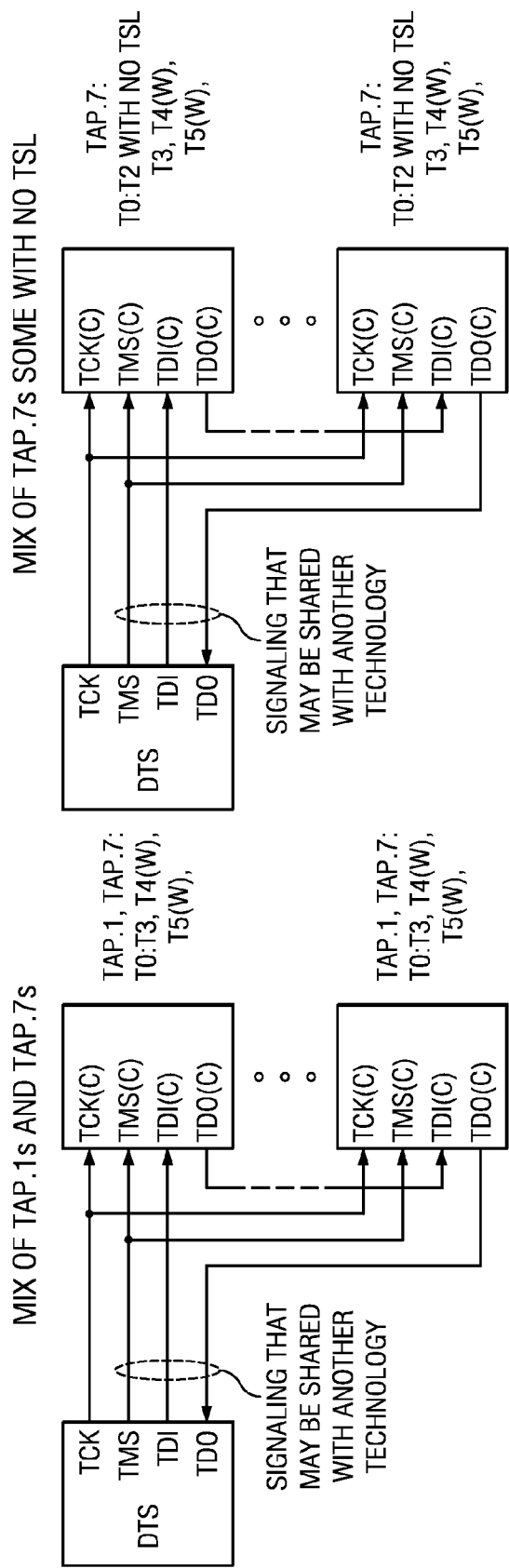
FIG. 6 is a series topology with mix of TAP.7s plus TAP.1s or TAP.7s with no TSL.

Series branches may be constructed from TAP.1s and four pin TAP.7s as shown in FIG. 6. This scan topology may share the TMS, TDI, and TDO connectivity with another topology provided TCK(C) or TMS(C) signal is used to select/deselect this topology.

In most cases, one or more TAP.7s is connected in one of the Scan Topologies shown in FIGS. 1-3. Note that the convention for naming DTS TDI/TDIC and DTS TDO/TDO signals in FIGS. 1-3 is: 1) The DTS TDI/TDIC signal sources chip TDI information; 2) The DTS TDO/TDOC signal is the destination for chip TDO information.

The Star-2 Scan Topology illustrated in FIG. 3 is a subset of both the Series and Star-4 Scan Topologies. This means that the Series and Wide Star Scan Topologies may be operated as a Star-2 Scan Topology when every test access port sharing the connection is a T4 and above TAP.7.

Chip TAPC Hierarchy

A hierarchical view of TAPCs within a chip is needed to maintain IEEE 1149.1 compliance and provide solutions to the compatibility requirements identified earlier. For a given chip, three or more levels of TAPC hierarchy are accommodated as follows:

$1^{st}$ level—a TAPC within the TAP.7 controller—the primary interface to the DTS.

$2^{nd}$ level—a TAPC at the chip-level (CLTAPC).

$3^{rd}$ level—embedded TAPCs connected to the chip-level TAPC.

TABLE 2

Branch/technology deployment permissibility

| Branch | Proprietary | TAP.1 | T0-T2 w/o TSL | T0-T2 w/ TSL | T3 | T4 (W) | T5 (W) | T4 (N) | T5 (N) |
|---|---|---|---|---|---|---|---|---|---|
| TAP.1 Series | No | Yes | Yes | Yes | Yes | Yes | Yes | No | No |
| TAP.7 Series | No | No | No | Yes | Yes | Yes | Yes | No | No |
| TAP.7 Star-4 | No | No | No | No | Yes | Yes | Yes | No | No |
| TAP.7 Star-2 | No | No | No | No | No | Yes | Yes | Yes | Yes |
| Proprietary | Yes | No | No | No | No | No | No | No | No |

Chips, Components, and Boards

With the TAP.7 architecture, any part of the connectivity shown in FIG. 4 may be deployed on a board, within a package, or within a chip. This comprehends the packaging and integration trends since the inception of the 1149.1 Standard.

The IEEE 1149.1 test view allows only one TAPC per component. The 1149.7 test view is a superset that allows multiple TAPCs per component. With the 1149.7 test view a component: is either a package containing one or more chips, or a direct mount chip; provides access to one or more TAP.1 or TAP.7 controllers through the same or separate pins; and provides access to proprietary TAPCs or other technologies through the same or separate pins.

Figure 5:
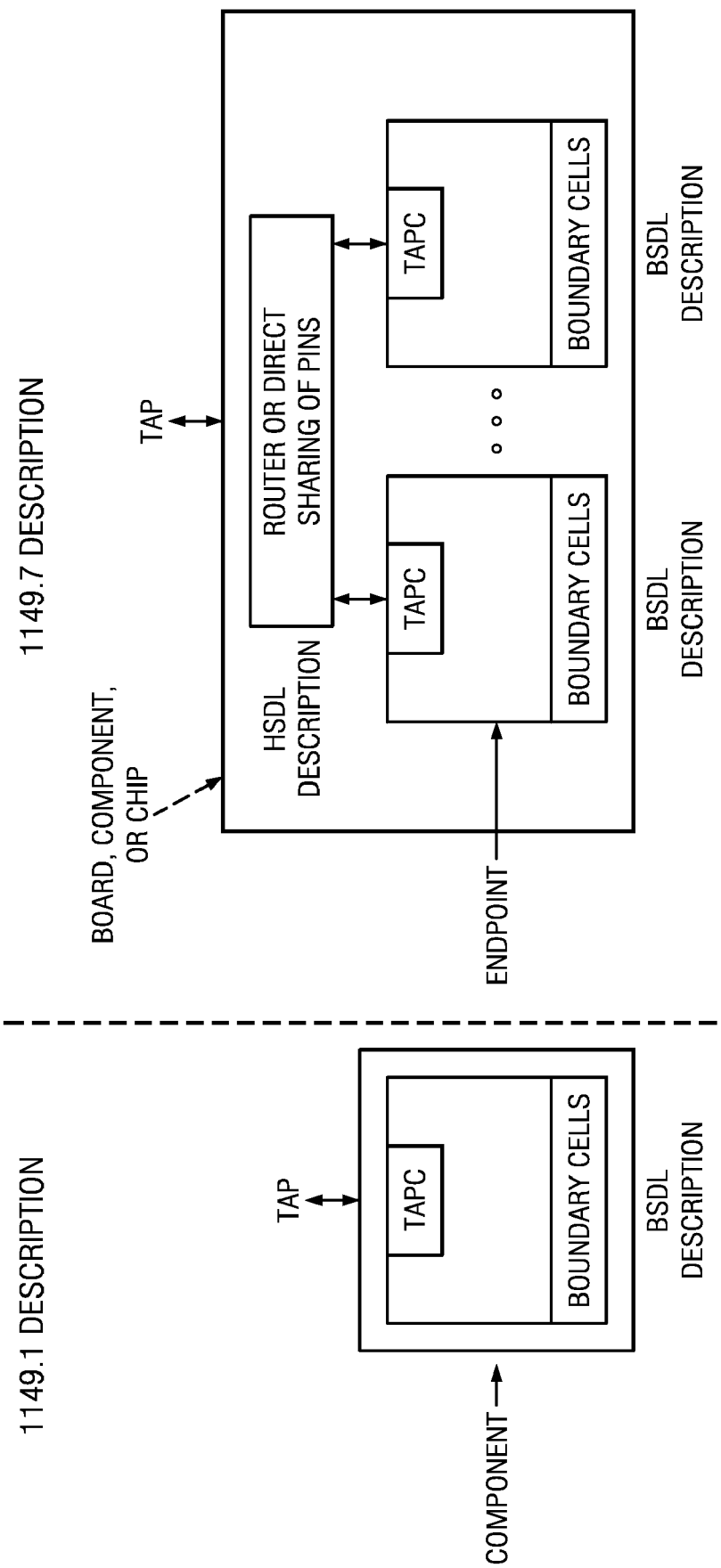
FIG. 5 is an illustration contrasting 1149.1 and 1149.7 test views.

This superset blurs the boundary between board, component, and chip. This blurring allows operation across those boundaries as shown in FIG. 5. When there is only one TAPC per component, the 1149.1 and 1149.7 test views are Other levels, if needed.

Figure 10:
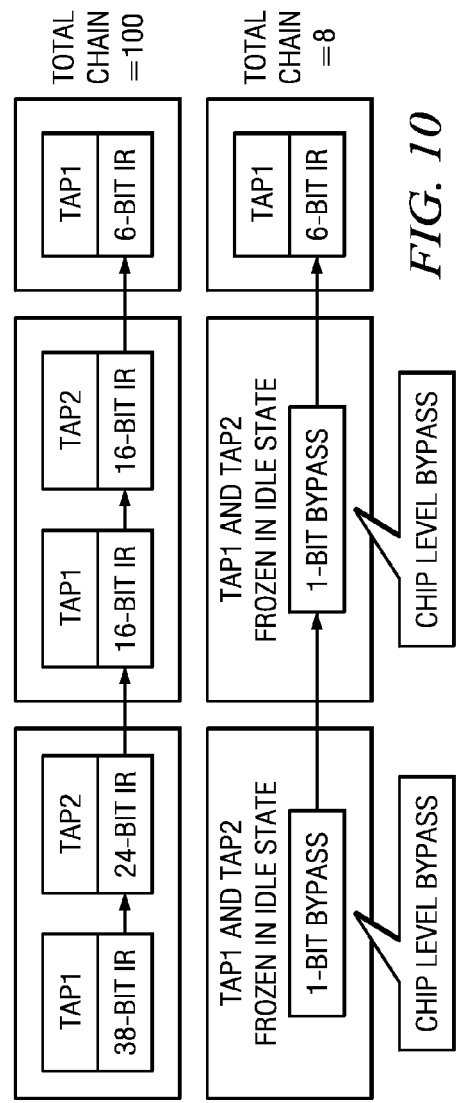
FIG. 10 is a block diagram illustrating bypass bits.

FIG. 10 is a block diagram illustrating a bypass bits that are provided to bypass the scan paths managed by the CLTAPC when it is deselected. With a Series Scan Topology this bypass bit allow faster propagation of a scan data between the DTS's TDI(C)and TDO(C) signals when the contents of the bypassed component is not of interest.

Figure 7:
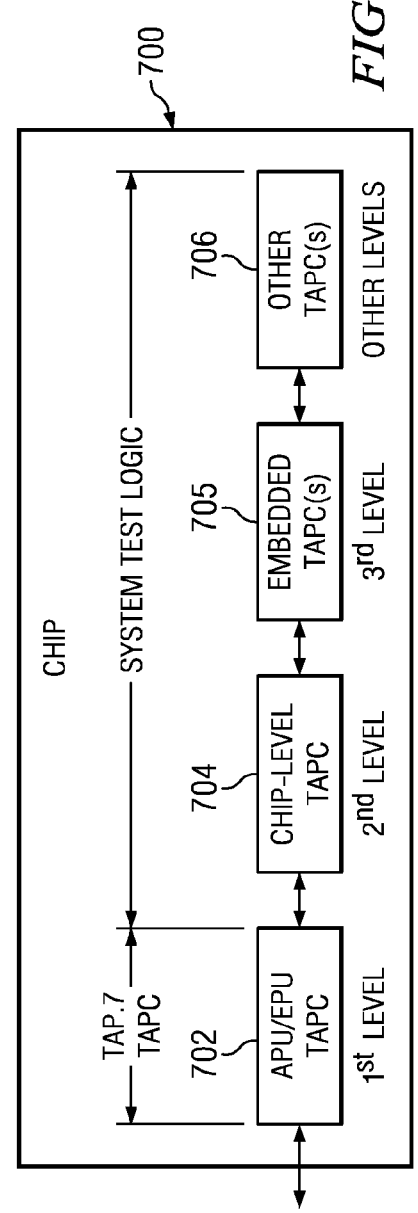
FIG. 7 is a block diagram illustrating TAP.7 TAPC hierarchy.

While all levels of the TAPC hierarchy need not be present in all chips, the TAP.7 architecture accommodates them when they occur. The TAPC hierarchy is shown in FIG. 7. Exemplary chip 700 includes TAPC 702 that is implemented as a T0 with control events or a TSL for T1 and above. Chip level TAPC (CLTAPC) 704 operates under Adapter TAPC (ADTAPC) 700. Embedded TAPC(s) (EMTAPCs) 705 operate under CLTAPC 704. Additional levels of EMTAPCs 706 may be embodied as needed. The EMTAPC(s) 705 and EMTAPC(s) 706 are hidden following a test reset.

A chip with IEEE 1149.7-compliant behavior always has a Chip-Level TAPC 702. It may also include one or more Embedded TAPCs 704, all of which are considered subordinate to the chip-level TAPC (CLTAPC). The CLTAPC is considered the parent of the Embedded TAPC(s). The addition of the Enhanced Protocol Unit (EPU) to a T1 or above TAP.7 controller adds the ADTAPC but does not add an instruction or data registers in series or parallel with those associated with the CLTAPC and the EMTAPCs. The ADTAPC is considered the parent of the CLTAPC. The addition of the Advanced Protocol Unit (APU) in a T4 or T5 TAP.7 does not add an additional TAPC or level of TAP.7 TAPC hierarchy.

The ADTAPC 702 is connected to the CLTAPC 704. The CLTAPC may provide access to EMTAPCs. The EMTAPCs are hidden following a Test Reset to present the test view of a component specified by the 1149.1 Standard. The "other TAPCs" portion of the hierarchy can have additional levels of hierarchy. The TAPC hierarchy may vary dramatically by chip, with the TAPs accessed varying by application. In one or more embodiments of the invention, the DTS dynamically manages the TAPC hierarchy to: accommodate a Star Scan Topology, minimize the length of the scan path, and avoid non-functional parts of the hierarchy.

Combined View of TAP Connectivity and TAPC Hierarchy

Figure 8:
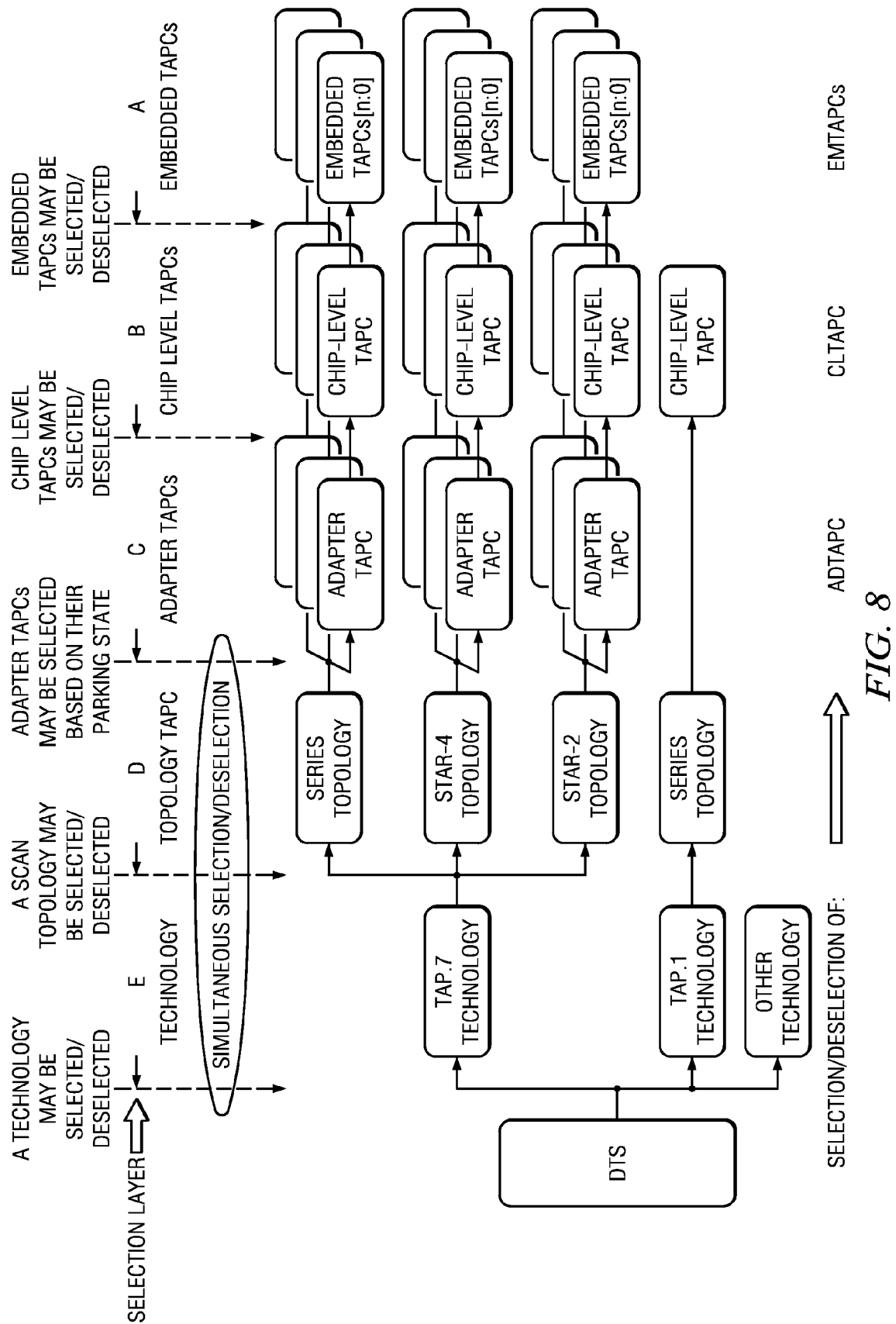
FIG. 8 is an illustrative block diagram of system connectivity supported by TAP.7 architecture.

The combination of the system shown in FIG. 4 and the TAP.7 TAP hierarchy shown in FIG. 7 creates the system connectivity and TAPC hierarchy shown in FIG. 8. The selection layers (labeled A-E) are shown this figure. The entities actually selected and deselected are shown at the bottom of this figure.

Selection Concepts

Additional selection concepts beyond those supported by the IEEE 1149.1 standard are provided to access to the CLTAPCs and EMTAPCs shown in FIG. 8. These concepts support: the use of the selection hierarchy, the parking of CLTAPC and EMTAPC states and resynchronization of the CLTAPC and EMTAPC to the state of their parent, and common signaling across technologies.

Hierarchical Selection and Deselection TAPCs

These concepts provide the DTS the means to interact with all or a subset of the technology connected to it. They provide a means to select the various levels of the hierarchy shown in FIG. 8. Lower levels of the hierarchy become usable when all nodes above it are selected and become unusable when any node above it is deselected. Selection and deselection is provided at the following nodes in the hierarchy: specific technology, Series, Star-4, Star-2, or all TAP.7 Scan Topologies, an ADTAPC within a TAP.7 Scan Topology (depending on the ADTAPC state), a CLTAPC connected to an ADTAPC, and EMTAPCs connected to a CLTAPC.

Determining the Scan Topology

In order for the Debug and Test System to select a particular scan topology, the TAP.7 controller's associated with a scan topology must be able to determine this association. The Debug and Test System can inform a TAP.7 controller as to the scan topology in which it resides in simple Scan Topologies. This is not the case with complex scan topologies.

Since T0-T2 TAP.7s can only be used with a Series Scan Topology, these TAP.7 controllers are presumed to be always operating in a Series Scan Topology. Since a T3 and above TAP.7 controller can be operated in either a Series or a Star-4 Scan Topology, T4(W) and T5(W) TAP.7s can be operated in Series, Star-4, and Star-2 Scan Topologies, and T4(N) and T5(N) TAP.7s can be operated in Star-2 Scan Topologies, a TAP.7 controller's association one of these scan topologies must be determined at run-time. This is accomplished using a process called Scan Topology Training.

With T3 and above TAP.7s, a TAP.7 controller determines the scan topology in which it resides with Scan Topology Training as follows. The Debug and Test System informs the TAP.7 controllers that Scan Topology Training is underway. It then stimulates the Scan Topology connected to it with TDI(C) and TDO(C) signal values and DR-Scans in a manner that produce differences in the TDI(C) and TDO(C) signal values and scan data observed by TAP.7 controllers in Series, Star-4, and Star-2 Scan Topologies. The TAP.7 controller records the TDI(C) and TDO(C) signal values along with scan data during Scan Topology Training in the Topology (TOPOL) Register. At the conclusion of the training, the TOPOL Register value identifies the scan topology in which the TAP.7 controller resides as the value of the TOPOL Register is are different for TAP.7 controllers deployed in Series, Star-4, and Star-2 Scan Topologies. Each T3 and above TAP.7 includes a TOPOL register, as indicated generally at 920 in FIG. 9.

Topology Register Function

The Topology Register values specify the topology as listed in Table 3.

TABLE 3

Topology Register Values

| TOPOL value | Topology | TDOC behavior |
|---|---|---|
| 00 | Star-4 | TDOC remains HI-Z |
| 01 | Series | TDOC may be driven |
| 10 | Star-4 with TDO drive allowed | TDOC may be driven |
| 11 | Star-2 | TDOC may be driven |

As shown in Table 3 The Topology (TOPOL) Register value affects two operating characteristics as shown in: it defines the TAP.7 topology that must be specified during selection sequences for the TAP.7 to be placed Online; and it provides a means to HI-Z the TDO signal to prevent drive conflicts that could occur when the scan topology involves both Series and Star-4 Scan technology branches in certain cases (not described herein).

Scan-Path Characteristics Used to Determine the Scan Topology

Figure 9:
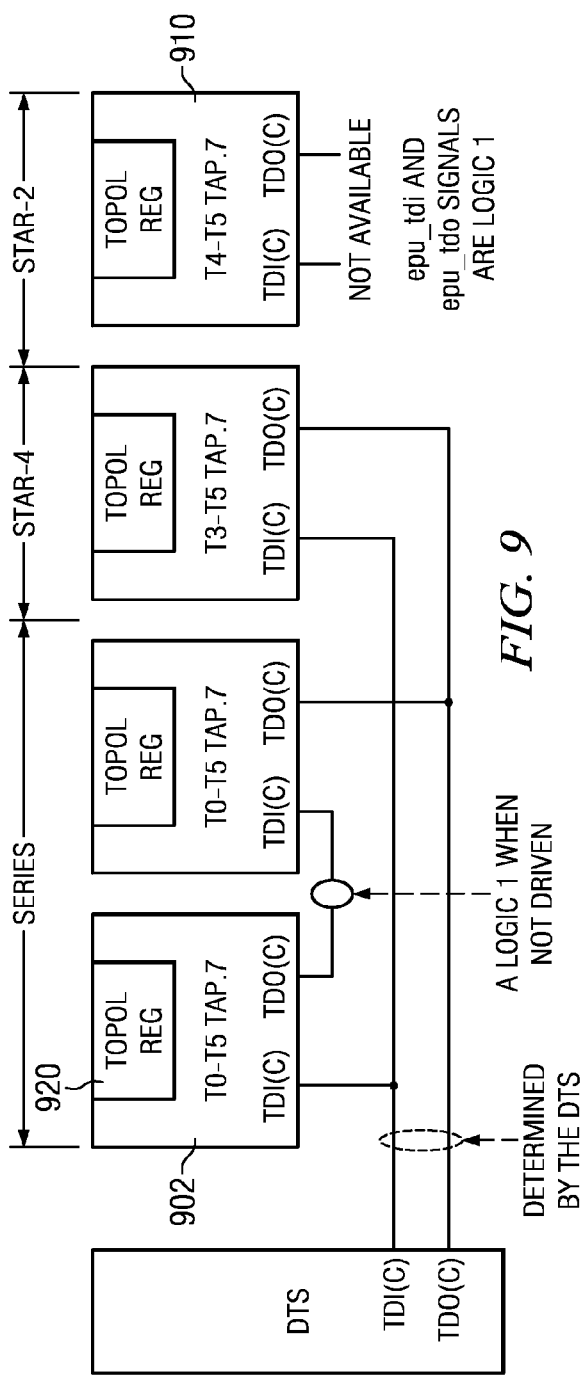
FIG. 9 is a block diagram illustrating system connectivity supported by the TAP.7 architecture.

FIG. 9 is a block diagram illustrating system connectivity supported by the TAP.7 architecture. Exemplary components indicated generally at 902 represent the various components in the target system. Each component includes a scan path that is one or more bits in length. Pins have pull-ups to establish logic value when they not driven. The device 910 does not have TDI(C) and TDO(C) pins. The internal inputs therefore are a logic 1 for these pins. A debug and test system is connected to the TCK(C), TMS(C), TDI(C), and TDO(C) pins. It is capable of driving both the TDI(C) and TDO(C) pins.

Referring again to FIG. 9, the following attributes of Series, Star-4, and Star-2 Scan Paths are used to determine the scan topology in which a TAP.7 controller is deployed. A Series Scan Topology provides scan-path continuity via TDI(C) and TDO(C). Only one of the TDI(C) and TDO(C) signals may be connected to the DTS unless there is only one TAP connected to the DTS. A Star-4 Scan Topology provides scan-path continuity via TDI(C) and TDO(C). Both the TDI(C) and TDO(C) signals are connected to the DTS. In a Star-2 Scan Topology the EPU's TDI signal and TDO inputs are fixed at a logic 1 value when these pins are either not implemented or the TDI(C) and TDO(C) pins are used for alternate functions.

A two step process, scan connectivity and scan continuity testing, that is orchestrated by the DTS exposes characteristics of a TAP.7 controller's connectivity used to determine the Scan Topology.

The scan connectivity test records the TDIC and TDOC signal values when both of these signals are driven by the DTS. This test determines whether a TAP.7 controller is deployed in a Star-4 Scan Topology. A logic 0 created by the DTS at the TDIC and TDOC signals can only be observed as such by TAP.7 controllers deployed in a Star-4 Scan Topology. TAP.7 controllers that are deployed in a Series or Star-2 Scan Topology observe either one or both of these signals as a logic 1. When the connectivity test determines the TAP.7 controller is deployed in a Star-4 Scan Topology, this determination survives the connectivity test that follows.

The connectivity test determines whether TAP.7 controllers that are not determined to be deployed in a Star-4 Scan Topology are deployed in a Series or Star-2 Scan Topology. This determination is made based on the scan data values observed during an all zeroes DR-Scan whose length is greater than the longest series scan path. A TAP.7 controller that observes logic 0 scan data is determined to be deployed in a Series Scan Topology while a TAP.7 controller that observes logic 1 scan data is determined to be deployed in a Star-2 Scan Topology. The connectivity and continuity tests are sufficient to determine the scan topology as shown in Table 4.

TABLE 4

Scan topology connectivity and continuity tests results

| | Connectivity test TDIC and TDOC signal value observations | | | Continuity test Scan data value observations along with no Star-4 determination by connectivity test | |
|---|---|---|---|---|---|
| TOPOL | TDIC | TDOC | Scan topology determination | Data observed | Scan topology determination |
| Series | 0b | 1b | No | 0b | Yes |
| Series | 1b | 0b | No | 0b | Yes |
| Series | 1b | 1b | No | 0b | Yes |
| Star-4 | 0b | 0b | Yes | 0b | — |
| Star-2 | 1b | 1b | No | 1b | Yes |

Scan Topology Training Command Sequence

Scan Topology Training utilizes the following sequence of commands to perform the connectivity and continuity tests: 1) CMD (STC2, APFC=Standard function), which configures the TDIC and TDOC pins of T4 and above TAP.7s as the T3 TAP.7 pin functions unless inhibited by the Chip-Level logic; 2) CMD (STC2, TOPOL=Star-4-HI-Z, unconditional), which sets the Topology Register for all T3 and higher TAP.7s to Star-4-HI-Z; 3) CMD (STMC, Test for Star-4 Scan Topology), which tests for a Star-4 Scan Topology while the DTS drives both TDI(C) and TDO(C) to a logic 0 during the Update-DR state of CP2 of the command; and 4) CMD (SCNB, Test for Series Scan Topology), which tests for a Series Scan Topology with a CR Scan of all zeros whose length is longer than the longest possible scan path.

The TOPOL Register records the results of connectivity and continuity tests performed by the STMC and SCNB Commands. The values of this register and their meaning are shown in Table 3. A Type-0-Type-3 Reset initializes this register value to 00b indicating Star-4-HI-Z when the startup option is Offline-at-Start-up-and to 01b indicating Series. Note that the Test-Logic-Reset state (a Type-4 Reset) does not change this register value. Subsequent to this, Scan Topology Training or commands may alter this value.

Connectivity Test

The STMC Command is used to perform the connectivity test. This command determines whether the scan topology is Star-4. The DTS drives the TDI(C) and TDO(C) signal values to a logic 0 value prior to the Update-DR state of Command Part 2 (CP2) of this command. The logic 0 TDI(C) and TDO(C) values can be easily accomplished using the following TAPC state machine state sequence to end CP2 of the STMC Command:

Exit1-DR>Pause-DR (N)>Exit2-DR>Update-DR>Select-DR-Scan>Capture-DR>Exit1-DR>Pause-DR (N)

The DTS may drive both TDI(C) and TDO(C) signals to a logic 0 beginning at a point within the first Pause-DR state and release the drive of the TDO(C) signal (or both signals) at a point within the second Pause-DR state of this series of states. TAP.7 controllers deployed in a Star-4 Scan Topology see both the TDI(C) and TDO(C) signals as a logic 0. TAP.7 controllers that are deployed in either a Star-2 or Series Scan Topology see at least one of these signals as a logic 1. The Update-DR state of this sequence samples the TDI(C) and TDO(C) values and sets the Scan Topology Register to 00b when TDI(C) and TDO(C) values are both a logic 0 and 01b otherwise. A logic 0 value is sufficient to determine that the TAP.7 controller is deployed in a Star-4 Scan Topology.

Continuity Test

When the TOPOL Register value is 00b, the drive of TDO(C) is inhibited. This allows both the use of commands to deselect the CLTAPC when the ADTAPC is placed online following being placed Online following Offline-at-Start-up and the use of an SCNB Command to perform the continuity test without a drive conflict. With this TOPOL Register value, the TDO(C) drive is inhibited until the SCNB part of the test is completed. This prevents TDO(C) drive conflicts that would otherwise be possible during the CR Scan of the SCNB Command. A Series Branch will drive TDO while Star-4 and Star-2 Branches will not. Only one TAP.7 controller may drive the DTS TDO(C) connection.

The SCNB Command determines whether the scan topology is Star-2 or Series with TAP.7 controllers that have not already determined they are deployed in a Star-4 Scan Topology. The CR Scan of this command uses all zeroes data with a length greater than or equal to the series scan-path length of the Series Scan Topology. The EPU Bypass Bit of a TAP.7 controller in a Star-2 Scan Topology is a logic 1 at the end of this CR Scan while the EPU Bypass Bit of a TAP.7 controller in a Series Scan Topology is a logic 0 at the end of this CR Scan. This difference defines the scan topology when the Update-DR state of the CR Scan occurs. The Update-DR state of the SCNB CR Scan also converts the 00b TOPOL Register value to 10b.

TABLE 5

Topology Tests/TOPOL register relationships

| Test | TDIC or TDOC signal observed as a logic 1? | Scan data observed as a == 1? | TOPOL Register | Resulting TOPOL Register value: |
|---|---|---|---|---|
| Connectivity | No | x | x | 00b - Star-4 HI-Z |
| | Yes | x | x | 01b - Series |
| Continuity | x | x | 00b | 10b - Star-4 |
| | x | No | 01b | 01b - Series |
| | x | Yes | 01b | 11b - Star-2 |

TABLE 6

TOPOL register initialization

| Type-0-Type-3 Reset? | Offline-at-Start-up? | Resulting TOPOL value: |
|---|---|---|
| No | x | |
| Yes | Yes | 00b - Star-4 HI-Z |
| Yes | No | 01b - Series |

It should be noted that in the case where there are two scan topologies the topology may be completely determined by a single test, depending on the two scan topologies involved. Should there be more than the above scan topologies involved, other technologies may also be detected with these tests or by adding additional tests. Topologies could also be made to learn about other Technologies sharing the DTS connection if desired.

TAP.7 Controller Selection/Deselection

TAP.7 controller selection is applicable to T0-T2 TAP.7s when they implement the Technology Selection Function (TSL) function. It is applicable to T3 and T5 TAP.7s.

Control events provide a means for the DTS to select, deselect, and reset the TAP.7 controller and other technologies sharing the TCK(C) and TMS(C) DTS connectivity. Control events are context sensitive when the technology is selected. A technology may ignore an improperly placed control events when they do not meet the qualification criteria defined by the technology when the technology is selected. Control events are not context sensitive when the technology is selected. A deselected technology unconditionally responds to control events as there is no qualification criterion when the technology is deselected. As a result, the improper placement of a control event that is to initiate selection when at least one TAP.7 controller is deselected will in most cases cause erroneous operation and is considered a programming error. A technology that is not operating, such as one that is being held in reset by chip level logic or one that is not powered, are not required to respond to a deselection and selection events. There are two control events, selection events and deselection events.

With a TAP.7 controller, the qualification criterion is determined by the use of the Standard or the Advanced Protocol. With the Standard Protocol, the selection and deselection events are always qualified. With the Advanced Protocol, these events are initiate their intended actions provided that they are coincident with the first bit of a Scan Packet (SP) when this bit of information is being sent from the Debug and Test System (DTS) to the Target System (TS). They are ignored otherwise.

Figure 11:
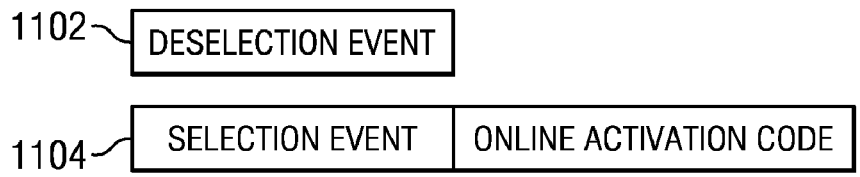
FIG. 11 is a conceptual view of selection and deselection event sequences.

Two deselection and selection event sequences are shown in FIG. 11. There may also be others. The deselection event 1102 is all that is required to deselect a technology. A selection event 1104 is followed by a 4-bit online activation code whose first bit follows the bit with the selection event. This code specifies the technology being selected. The TAP.7 Series, Star-4, and Star-2 Scan topologies and the combination of each of these scan topologies are considered a technology, all of which may be specified by the online activation code. Information following this code is technology specific. A technology that is not selected by the Online Activation Code is placed offline and ignores technology specific information following this code.

The deselection and selection event sequences shown in FIG. 11 are sent from the DTS to the various ADTAPCs within the Target System via the TCK(C) and TMS(C) signal lines. A TAP.7 TAPC interprets the count of the number of TMS(C) edges while TCK(C) is a logic 1 as one of four control events called escape sequences. Each escape sequence has a different function and TMS(C) edge count. Escape sequences, their edge count, and their function are described below. Table 7 lists the escape sequences.

TABLE 7

Escape Sequences signaled via TMS(C) and TCK(C)

| Type | Edges | Description |
|---|---|---|
| Custom | 2 or 3 | Performs a technology specific function. |
| Deselection | 4 or 5 | Initiates the deselection of an online technology. |
| Selection | 6 or 7 | Initiates the selection of a technology via a subsequent selection test. |
| Reset | >7 | Resets all technologies (generates a Type-3 TAP.7 TAPC reset) |

The DTS creates an escape sequence by generating one or more TMS(C) edge pairs while the TCK(C) signal is a logic 1 value. Even and odd TMS(C) edge counts beginning with two are given the same meaning. This accommodates the case where a change of state of the TMS(C) signal related to data occurs while the TCK(C) is a logic 1. This can occur because of propagation delays when a change in state of the TMS(C) signal is initiated by a falling edge of TCK(C) or by a change in state of the TMS(C) signal initiated by a rising edge of TCK(C).

General Selection Behavior with Selection/Deselection Events

Figure 12:
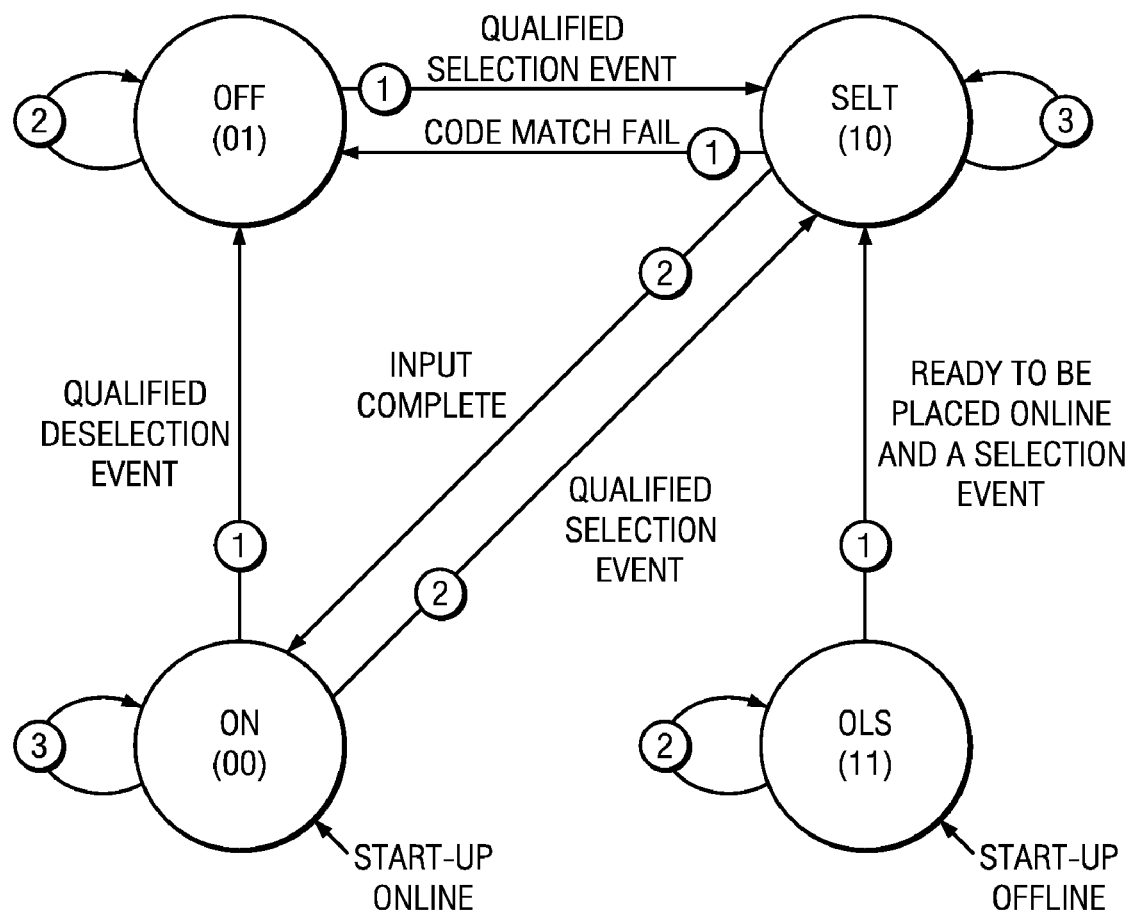
FIG. 12 is a exemplary state diagram for technology selection.

The state diagram shown in FIG. 12 describes the selection/deselection behavior. The OLS state indicates the technology is offline at start-up and remains in offline operation until selected. The SELT state selects the mode of operation. The OFF state indicates offline operation. The ON state indicates online operation. The TAPC state is maintained in state logic 1902, illustrated in FIG. 19A.

TAP.7 Selection/Deselection Sequences

Figure 13:
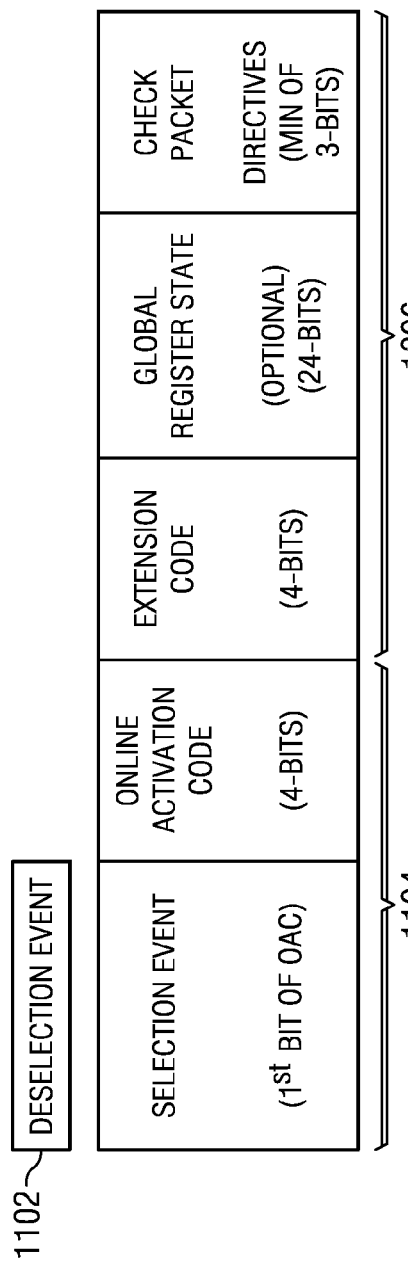
FIG. 13 is an exemplary view of TAP.7 selection and deselection event sequences.

As illustrated in FIG. 13, when a selection event initiates the selection sequence shown in FIG. 11 and it specifies the selection of a TAP.7 controller, it is followed by additional selection and control information 1306. Note that in this expanded sequence, an Extension Code follows the Online Activation Code. This Extension Code specifies whether the TAP.7 global registers are loaded following the Extension Code (whether the selection sequence is a long or short form selection sequence) in addition to specifying additional selection criteria. A Check Packet (CP) follows the last of the extension code or the global register load. Directive(s) within the CP determine when the selection process ends. This information is described in the following tables: Online Activation Code—Table 8, Extension Code—Table 9, Global Register State—Table 10, Check Packet Directives—Table 20.

Figure 14:
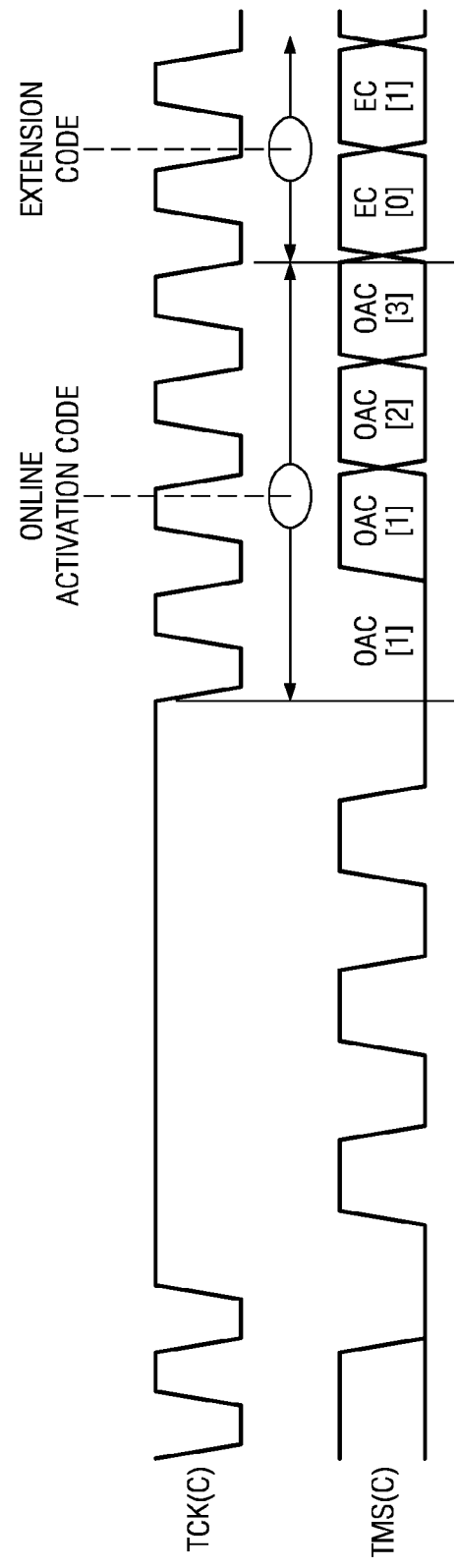
FIG. 14 is a timing diagram illustrating event selection and subsequent data timing.

FIG. 14 is a timing diagram illustrating event selection and subsequent data timing. A TAP.7 controller uses the data coincident with a qualified selection event as the LSB of the Online Activation Code as shown in FIG. 14. A TAP.7 controller uses the Online Activation Code format shown in Table 8. A TAP.7 controller uses the bit of information following the Online Activation Code as the LSB of the Extension Code as shown in FIG. 14. A TAP.7 controller uses the Extension Code format shown in Table 9. A TAP.7 controller uses the Global Register Information format shown in Table 10.

TABLE 8

Online Activation Code

| Field | Value | OAP - Online Activation Code |
|---|---|---|
| 03:00 | yyxx | Technology selection:<br>xx==0: yy:==0:TAP.7 Series, Star-4, or Star-2 Topology,<br>yy = 1: TAP.7 Series Topology,<br>yy = 2: TAP.7 Star-4 Topology,<br>yy = 3: TAP.7 Star-2 Topology,<br>1: TAP.7 technology, reserved,<br>2-3: May be used to select other technologies |

TABLE 9

Extension Code

| Field | Value | Extension Code |
|---|---|---|
| 02:00 | yy | STATE - Resynchronization State<br>Resynchronizing State - state required for placement online and resynchronization:<br>yy==0: Run-Test/Idle,<br>1: Select-DR-Scan,<br>2: Pause-IR,<br>3: Pause-DR |
| 02 | y | PROTECTED-Protected Drive Policy<br>Restrict drive policy:<br>y==0: No change in drive policy<br>1: Set CGM Selection Count, Scan Group Candidate Count, and Potential Scan Group Membership Counts to indicate more than one member, candidate, or potential selection |
| 03 | y | NGRLD—No Global Register State Load<br>The information following the Extension Code is:<br>y==0: The Global Register State (a long form selection sequence)<br>1: A Check Packet (a short form selection Sequence) |

TABLE 10

Global Register State

| Field | Value | Global Register State |
|---|---|---|
| 12:09 | yyyyy | Reserved - send as a logic 0. |
| 14:13 | yy | TPREV—Transport Protocol Revision value |
| 19:15 | yyyyy | TPST—Data Channel State Enables value |
| 22:20 | yyy | TPDEL—Transport Data Element Length value |
| 24:23 | yy | RDYC—Ready Control value |
| 26:25 | yy | DLYC—Delay Control value |
| 31:27 | yyyyy | SCNFMT—Scan Format value |

TAP.7 Control State Machine

Figure 15:
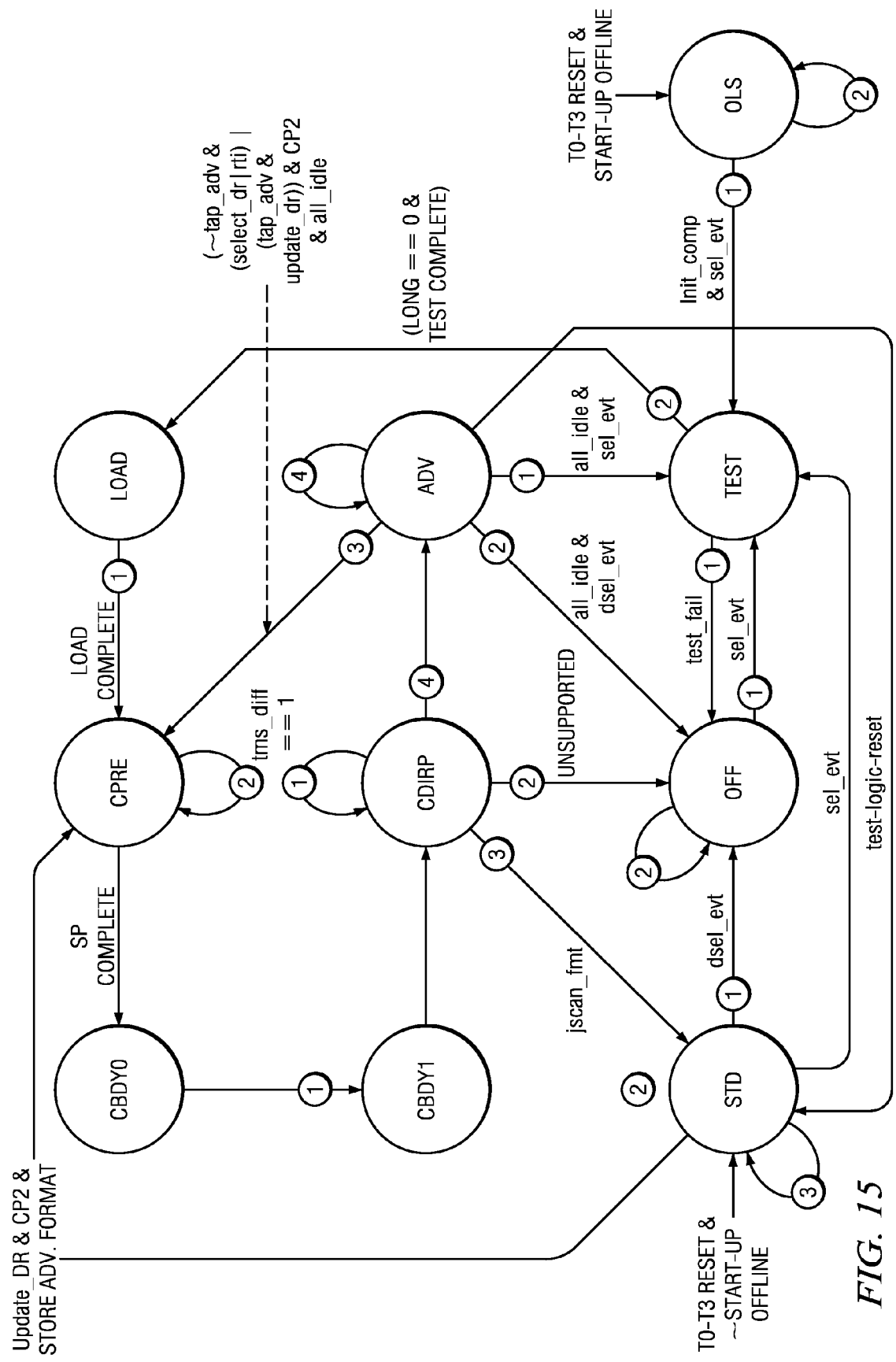
FIG. 15 is an exemplary state diagram for the control state machine.
Figure 19A:
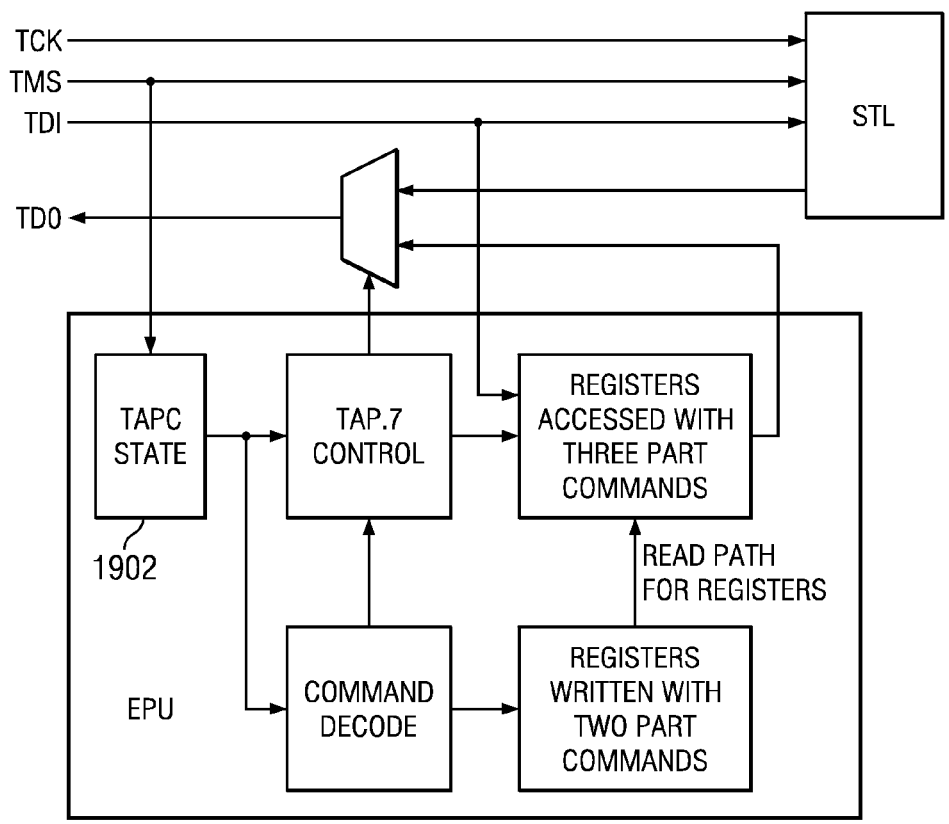
FIGS. 19A and 19B are exemplary block diagrams of TAPC registers.

The TAP.7 controller implements the technology selection state diagram function shown in FIG. 12 with a number of sub states. The collection of these sub states is called the Control State Machine (CSM). A conceptual model of the Control State is shown in FIG. 15. Table 11 identifies the relationship of the CSM state machine state to the Technology Selection States shown in FIG. 12. The control state is maintained in the state logic on each TAPC, as illustrated in FIG. 19A.

The OLS state indicates the TAP.7 controller is offline at start-up and remains in offline operation until selected. The TEST state indicates the controller is processing an online activation code and extension code. If a valid activation code is not detected, the controller transitions to the OFF state and remains in offline operation. If a correct activation code is detected, the controller transitions to the LOAD state and loads global registers. It then transitions to the CPRE state and evaluates the preamble CP bit. It then transitions to the CBDY0 state and evaluates the first CP directive bit and then in CBDY1 evaluates the second CP directive bit. It then transitions to the CDIRP state and processes the received directive. Depending on the directive, it then transitions to the ADV state and uses an advanced protocol for operation or it transitions to the STD state and uses the standard protocol for operation. Once operation is complete, it transitions back to the OFF state and waits for reception of the next event.

TABLE 11

General/TAP.7 controller state mapping

| Technology Selection State | Control State Machine equivalent collection of sub states |
|---|---|
| ON | STD, ADV |
| OFF | OFF |
| OLS | OLS |
| SELT | TEST, LOAD, CPRE, CBDY0, CBDY1, CDIRP |

The models used for T0-T3 and T4 and above TAP.7s used different high level state names (ON and WAIT vs. BPA, CCA, SPA, and TPA). This change of names emphasizes that the selection state functions of the T4-T5 is a superset of the very similar T0-T3 selection state functions. The function of ON and WAIT T0-T3 TAP.7 operating states and the T4-T5 BPA, CPA, SPA, and TPA operating states with the Control State Machine states shown in Table 11.

Table 12 identifies the Control State Machine states that are mandatory and optional in some embodiments with T0-T2 TAP.7 that do not support TAP.7 controller selection and deselection, T0-T3 TAP.7 supporting TAP.7 controller selection and deselection, and T4 and above TAP.7 controllers.

With T4-T5 TAP.7s, the CPRE state is added to the WAIT function and the ADV state represents the SPA and TPA operating states.

TABLE 12

Mandatory and optional control state machine states

| Operating State | | Control State | Mandatory/Optional (M/O) T0-T2 | | T3 | T4 and above |
|---|---|---|---|---|---|---|
| T0-T3 TAP.7 | T4 and above TAP.7 | Machine State | Always Selected | Dynamically Selectable | | |
| ON | BPA | STD | M | M | M | M |
| WAIT | CCA | OFF | — | M | M | M |
| | | TEST, | — | M | M | M |
| | | LOAD, | — | M | M | M |
| | | CPRE | — | — | — | M |
| | | CBDY0 | — | M | M | M |
| | | CBDY1 | — | M | M | M |
| | | CDIRP | — | M | M | M |
| | | OLS | — | O | O | M |
| — | SPA | ADV | — | — | — | M |
| — | TPA | ADV | — | — | — | M |

Control Event Qualification

A technology may place restrictions on the use of events other than the reset event when it is selected. This is called event qualification. With the TAP.7 controller, the criteria used to qualify events other than the reset event are defined by the Control State Machine state. An event can only affect the Control State Machine state behavior when it is qualified. It is ignored otherwise. It is the DTS's responsibility to use these events in a manner that meets a TAP.7 controller's qualification criteria as a failure to do so may cause erroneous operation.

Standard State (STD)

The behavior of the STD state is governed by Table 12. The Standard Protocol is used in this state with TAP.7 TAPC state machine state advancing every TCK(C). With the STD state selection and deselection events are always qualified. A deselection event places the controller offline with the TAPC state machine state parked in the state created by the TMS value coincident with the deselection event. A selection event initiates a selection test. The test results place the TAP.7 controller either online or offline.

Parking State Considerations

The parking state created by placing a TAP.7 controller offline must be considered when using selection and deselection events. A qualified selection or deselection event may park the TAP.7 controller in any TAPC state machine state. The resynchronization of the TAPC requires its TAPC state machine state be one of the following parking states or pair of states: Pause-DR, Pause-IR, Select-DR, Run-Test/Idle or Test-Logic-Reset.

There is no need to utilize a parking state other than one of the states listed above. If the TAP.7 TAPC state machine state is parked in a state other than one of the TAPC states listed above it will remain offline at least until a Type-0 through Type-3 reset occurs changing the TAPC state to the Test-Logic-Reset state.

With the Standard Protocol, selection and deselection events must be coincident with a TMS value associated with TAPC state machine where the combination of these produces one of the states listed above if subsequent re-synchronization is required. The state and TMS combinations producing parking states allowing resynchronization are shown in Table 13.

TABLE 13

Offline placement that allows subsequent placement online

| Deselection event concurrent with: State machine state | TMS | Resulting Parking State | Subsequent selection possible |
|---|---|---|---|
| Update-DR, Update-IR, Run-Test/Idle, | 0 | Run-Test/Idle, | Yes |
| Update-DR, Update-IR | 1 | Select-DR-Scan | Yes |
| Exit1-IR, Pause-IR | 0 | Pause-IR | Yes |
| Exit1-DR, Pause-DR | 0 | Pause-DR | Yes |
| Select-IR, Test-Logic Reset | 1 | Test-Logic Reset | Yes |
| Other combinations | | None of the above | No |

FIGS. 16A and 16B are timing diagrams illustrating selection and deselection, respectively, with the standard protocol. Table 14 lists the controller behavioral state changes while in the STD state.

TABLE 14

TAP.7 controller behavior in the STD state

| Type-0-Type-3 Reset? | Offline-at-Startup? | Qualified Selection Event? | Qualified Deselection Event? | Test-Logic-Reset? | CP needed? | Next State | Next Behavior |
|---|---|---|---|---|---|---|---|
| Yes | No | X | x | x | x | STD | Operation with the Std. Protocol |
| Yes | Yes | X | x | x | x | OLS | Offline at Start-up |
| No | x | Yes | x | x | x | TEST | Initiating Selection Test |
| No | x | No | Yes | x | x | OFF | Offline |
| No | x | No | No | Yes | x | STD | Operation with Std. Protocol |
| No | x | No | No | No | Yes | CPRE | Input CP preamble bit |
| No | x | No | No | No | No | STD | Operation with the Std. Protocol |

Advanced State (ADV)

When the advanced Protocol is being used with the TAP.7 controller, it advances its TAPC state machine state once for every scan packet (SP) that is not followed by a CP. Its behavior is governed by Table 15. A qualified deselection event places the TAP.7 controller offline. A qualified selection event initiates a selection sequence that places the TAP.7 controller either online or offline. The qualification of selection and deselection events is described in the following paragraphs.

Qualified selection and deselection events initiate Control State Machine state changes while in the ADV state. In this state, these events are qualified when they follow the last bit of one of the following: an SP that is not followed by a CP or transport packet (TP), a TP that follows an SP, or a CP. These events are ignored when these conditions are not met as shown in Table 15.

The DTS is responsible for using these events in a manner where they are not ignored. Selection events that are ignored are problematic. If a TAP.7 controller in the ADV state utilizes the information following the selection event erroneously, it may lose synchronization with the DTS. It is therefore the DTS's responsibility to use deselection and selection events in a manner in which they are not ignored.

A qualified deselection parks the TAPC state machine state in the TAPC state created by the last SP as shown in Table 15.

TABLE 15

Event coincidence relationships with the advanced protocol

| Deselection event concurrent with 1st bit of SP associated with: | Resulting Parking State | Subsequent selection is possible |
|---|---|---|
| Run-Test/Idle | Run-Test/Idle, | Yes |
| Select-DR-Scan | Select-DR-Scan | Yes |
| Pause-IR | Pause-IR | Yes |
| Pause-DR | Pause-DR | Yes |
| Other combinations | None of the above | No |

Figure 17:
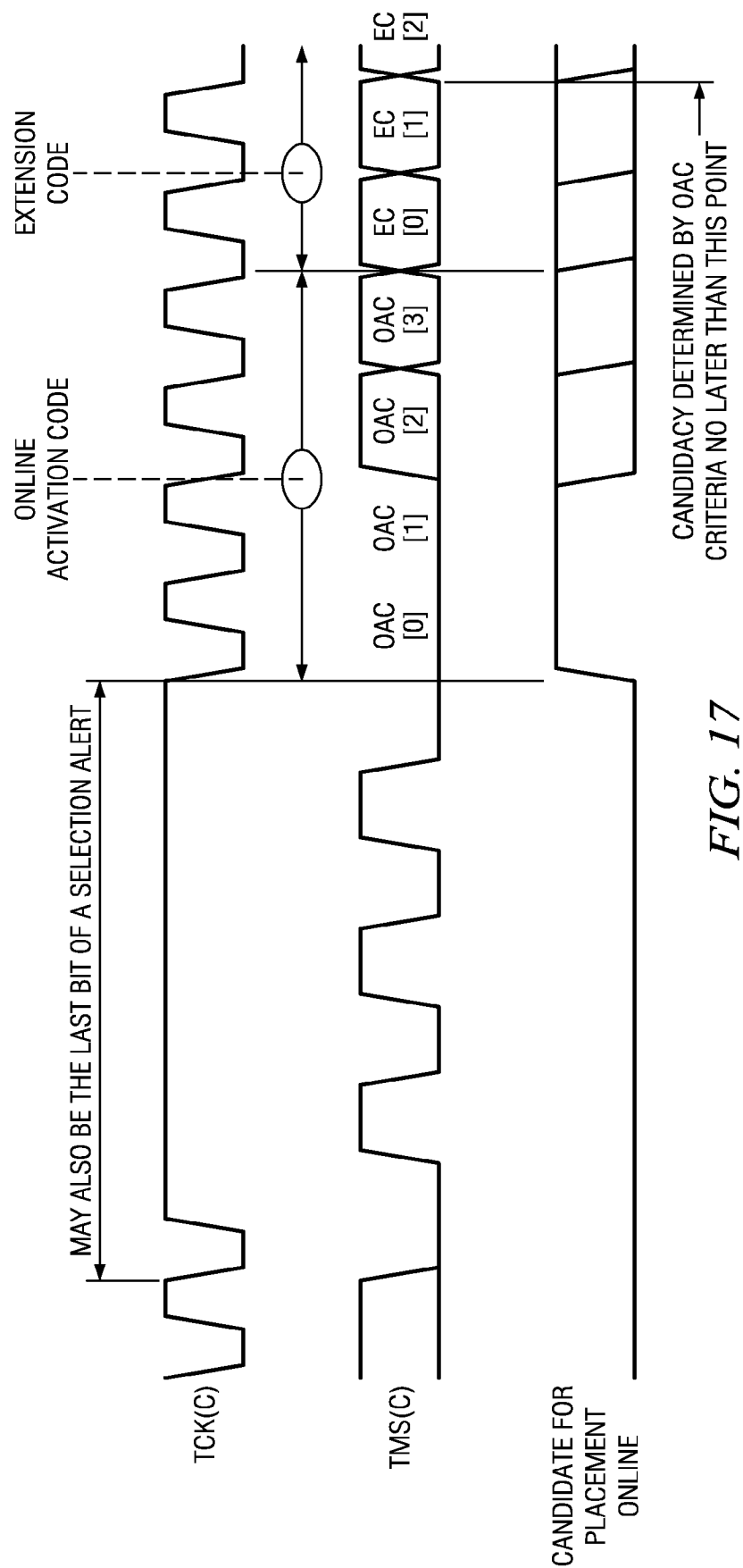
FIG. 17 is a timing diagram illustrating selection with the advanced protocol.

FIG. 17 is a timing diagram illustrating selection with the advanced protocol. When in the ADV state, the qualification of selection and deselection events is governed by Table 16. The TAP.7 controller behavioral state changes while in the ADV state are governed by Table 17.

TABLE 16

Selection and event qualification in the ADV state

| Occurrence | Event is Qualified? | Event is Ignored? |
|---|---|---|
| Following the last bit of a: | Yes | No |
| SP that is not followed by a CP or TP. | | |
| A TP that follows an SP | | |
| A CP | | |
| Other conditions | No | Yes |

TABLE 17

TAP.7 controller behavior while using the advanced protocol

| Type-0-Type-3 Reset? | Offline-at- Startup? | Qualified Selection Event? | Qualified Deselection Event? | Test-Logic- Reset? | CP needed? | Next State | Next Behavior |
|---|---|---|---|---|---|---|---|
| Yes | No | x | x | x | x | STD | Operation with the Std. Protocol |
| Yes | Yes | x | x | x | x | OLS | Offline at Start-up |
| No | x | Yes | x | x | x | TEST | Initiating Selection Test |
| No | x | No | Yes | x | x | OFF | Offline |
| No | x | No | No | Yes | x | STD | Operation with Std. Protocol |
| No | x | No | No | No | Yes | CPRE | Input CP preamble bit |
| No | x | No | No | No | No | ADV | Operation with the Adv. Protocol |

Offline State (OFF)

When a technology is offline, it does not operate. It ignores custom and deselection events. It processes the selection and reset events. A selection event causes a state change to the SELT state where it may be placed either offline or online. With a TAP.7 controller this state transition is to the TEST state. An offline TAP.7 controller begins a selection test when a selection control event is detected provided a T0-T3 reset is not active.

Test State (TEST)

Figure 18:
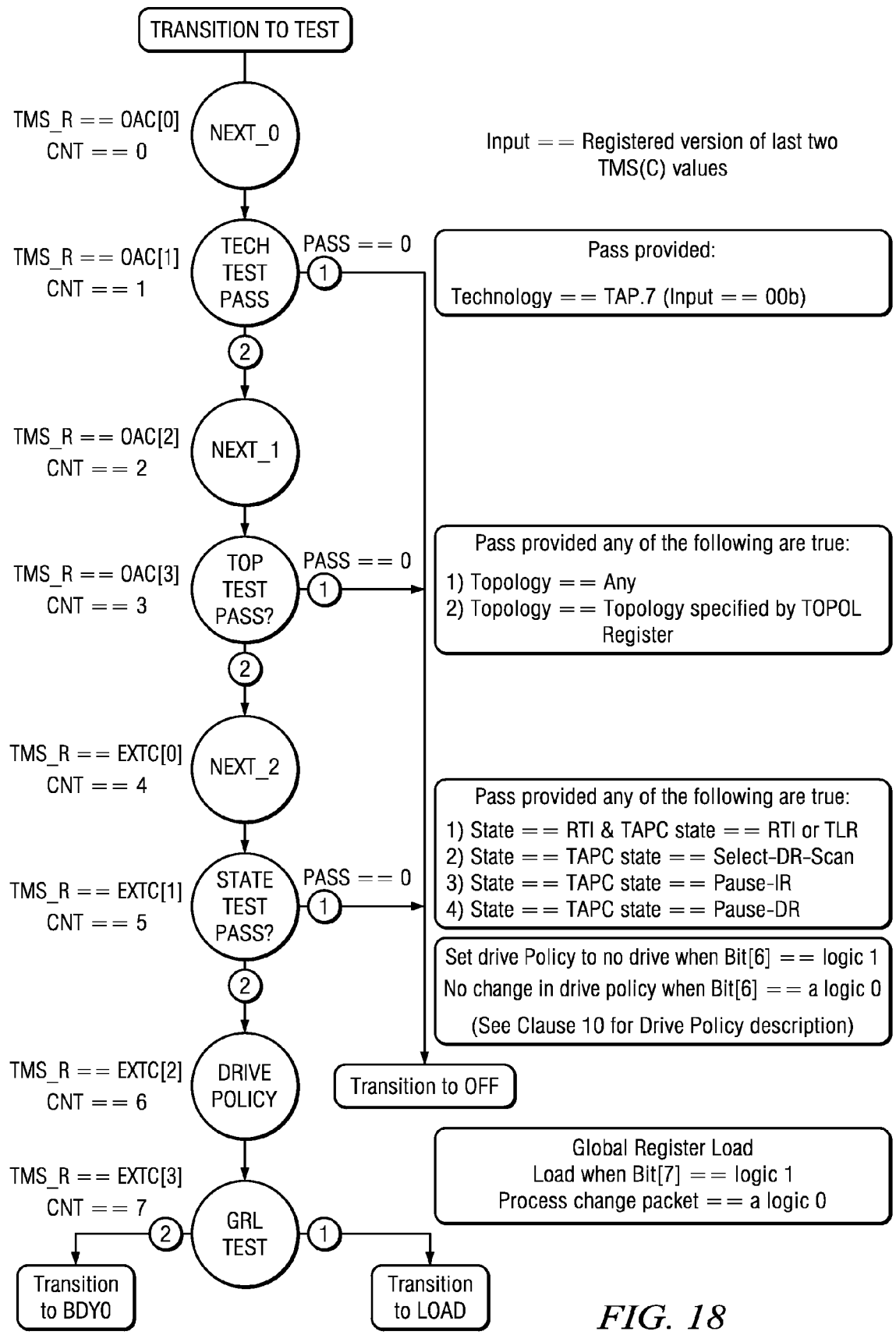
FIG. 18 is an exemplary state diagram for the TEST function.

A conceptual view of the function that is provided by the TEST state is shown in FIG. 18. This state assures the TAP.7 controller meets the test criteria for being placed online and defines the TMSC/TDO(C) drive policies to be used when normal operation resumes. It also determines whether a load of global registers is expected.

A three part selection test is performed in this state. These parts determine whether the TAP.7 controller's technology is being selected, whether either All or the scan topology defined by TOPOL Register is being selected, and whether the TAP.7 controller state machine state is compatible with resynchronization to the DTS. Failing any of these tests places the TAP.7 controller offline.

When the TAP.7 technology is selected, the second test stores the SCNFMT Register with one of the following values base on the scan topology defined as the test criteria as shown in Table 15: All -JScan2; Series-JScan2; Star-4-JScan3; or Star-2-OScan1.

The TAP.7 controller develops the drive TDO and TMSC drive policy by monitoring command and scan selection directives (SSD) activity. Since the monitoring ceases when the controller is placed offline, its drive policy may not be current when it is placed online. A means to arbitrarily force the drive policy to a state where it provides drive protection is provided to deal with this case. Drive conflict prevention is invoked when the PROTECTED bit of the Extension Code (bit[2]) is a logic 1. This register bit leaves the drive policy unchanged when a logic 0. The drive policy description includes the effects of this action. When the LONG bit in the Extension Code (bit[3]) is a logic 1, a load of the TAP.7 controller registers follows the Extension Code. A CP follows the Extension code otherwise.

Referring still to FIG. 18, TEST operation is performed in the absence of a T0-T3 Reset and a Selection Control Event. Table 18 describes operation of a TAP.7 controller performing a selection TEST operation.

TABLE 18

TEST operation
A TAP.7 controller performing a selection test is placed on offline when the selection test determines any of the following are true:

| | |
|---|---|
| 1 - The Online Activation Code governed by Table 8 specifies: | - A reserved TAP.7 technology<br>- A technology other than TAP.7 technology. |
| 2 - The Online Activation Code value governed by Table 8 specifies the TAP.7 Star-2 topology and any of the bullets to the right are true: | - The TAP.7 Class is T0-T2.<br>- The Topology Register value indicates deployment in a Star-4 or Series Scan Topology |
| 3 - The Online Activation Code value governed by Table 8 specifies the TAP.7 Star-4 topology and any of the bullets to the right are true: | - The TAP.7 Class is T0-T2.<br>- The Topology Register value indicates deployment in a Star-2 Scan Topology<br>- The Topology Register value indicates deployment in a Series Scan Topology. |
| The Online Activation Code value governed by Table 8 specifies the TAP.7 Series topology and any of the bullets to the right are true: | - The Topology Register value indicates deployment in a Star-4 Scan Topology<br>- The Topology Register value indicates deployment in a Star-2 Scan Topology |
| The Extension Code value governed by Table 9 specifies a TAPC state machine state that is different than the TAP.7 controller state machine state | |
| The CPA state is exited using a CP_END directive and bullets to the right are true: | - The SCN_FMT Register value specifies an unsupported scan format.<br>- The TPST Register is non-zero and TAP.7 class is T0-T4.<br>- The TPST Register is non-zero and the TPREV Register is non-zero.<br>and be placed online otherwise. |

A TAP.7 controller performing a selection test sets the Coupling Count (CC), Next Coupling Count (NCC), and CAPE Selection Count (CSC) to indicate More-Than-One-Selection provided all of the following are true: the TAP.7 controller has not been place offline, and the value of the PROTECT Bit in the Extension Code is a logic 1 with drive policy remaining unchanged otherwise.

A TAP.7 controller that has not been placed offline processes the bit of information following the Extension Code as one of the following: the BDY0 bit of a CP provided the LONG bit of the Extension Code is a logic 0, or the LSB of the Global Register State provided the LONG bit of the Extension Code is a logic 1. A TAP.7 controller that has not been placed offline sets the scan format to a value based on the TAP.7 topology specified by the Online Activation Code[3:2] as shown in Table 19.

TABLE 19

SCNFMT Register value resulting from the Topology Selection Test

| Online Activation Code[3:2] | Selection Criteria Topology | Resulting Scan Format Value |
| --- | --- | --- |
| 0 | All | JScan2 |
| 1 | Series | JScan2 |
| 2 | Star-4 | JScan3 |
| 3 | Star-2 | OScan1 |

Load Global Registers (LOAD)

Figure 19B:
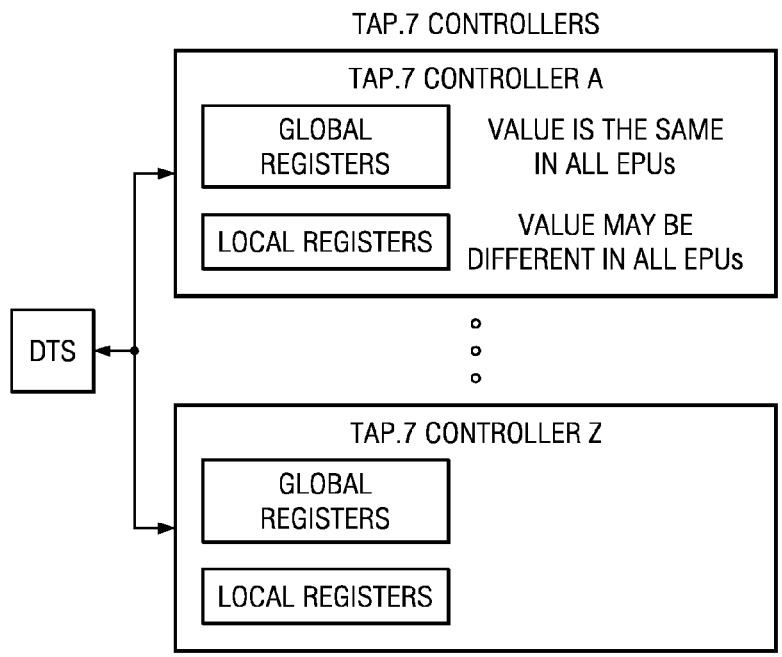

FIGS. 19A and 19B are exemplary block diagrams of the TAPC registers. Many registers are written with two-part commands. Certain other registers may be read, written, or simultaneously read and written with a control register (CR) scan of a three-part command. There are two types of TAP.7 controller registers, global and local, as shown in FIG. 19B. A local register is private TAP.7 controller information used to manage the characteristics of a specific TAP.7 controller. Local registers are stored using TAP.7 controller commands dedicated for this purpose. A local register with a specific name may have a different value in each TAP.7 controller. They manage functions such as the selection of certain control scan paths in a TAP.7 controller. An example of a local register is the Functional Reset (FRESET) Register used to initialize a functional reset within a chip A global register is a copy of configuration information required for the joint operation of the TAP.7 controllers sharing the DTS connection. These registers manage TAP.7 controller functions that affect the synchronized operation of a TAP.7 controller. An example of a global register is the Scan Format (SCNFMT) Register used to define the DTS/TS signaling protocol for scan transfers.

Global registers are stored using TAP.7 controller commands dedicated for this purpose. They are stored simultaneously in all Online TAP.7 controllers using TAP.7 controller commands dedicated to managing global registers. Their value changes synchronously in all Online TAP.7 controllers. A second means of storing global registers is provided with TAP.7 controller selection via the Control Protocol following a Selection Escape Sequence. The operation of commands and attributes of the Control Protocol assure Global Registers have the same value in all TAP.7 controllers whose ADTAPC state is not parked (an Online TAP.7 controller).

Figure 19C:
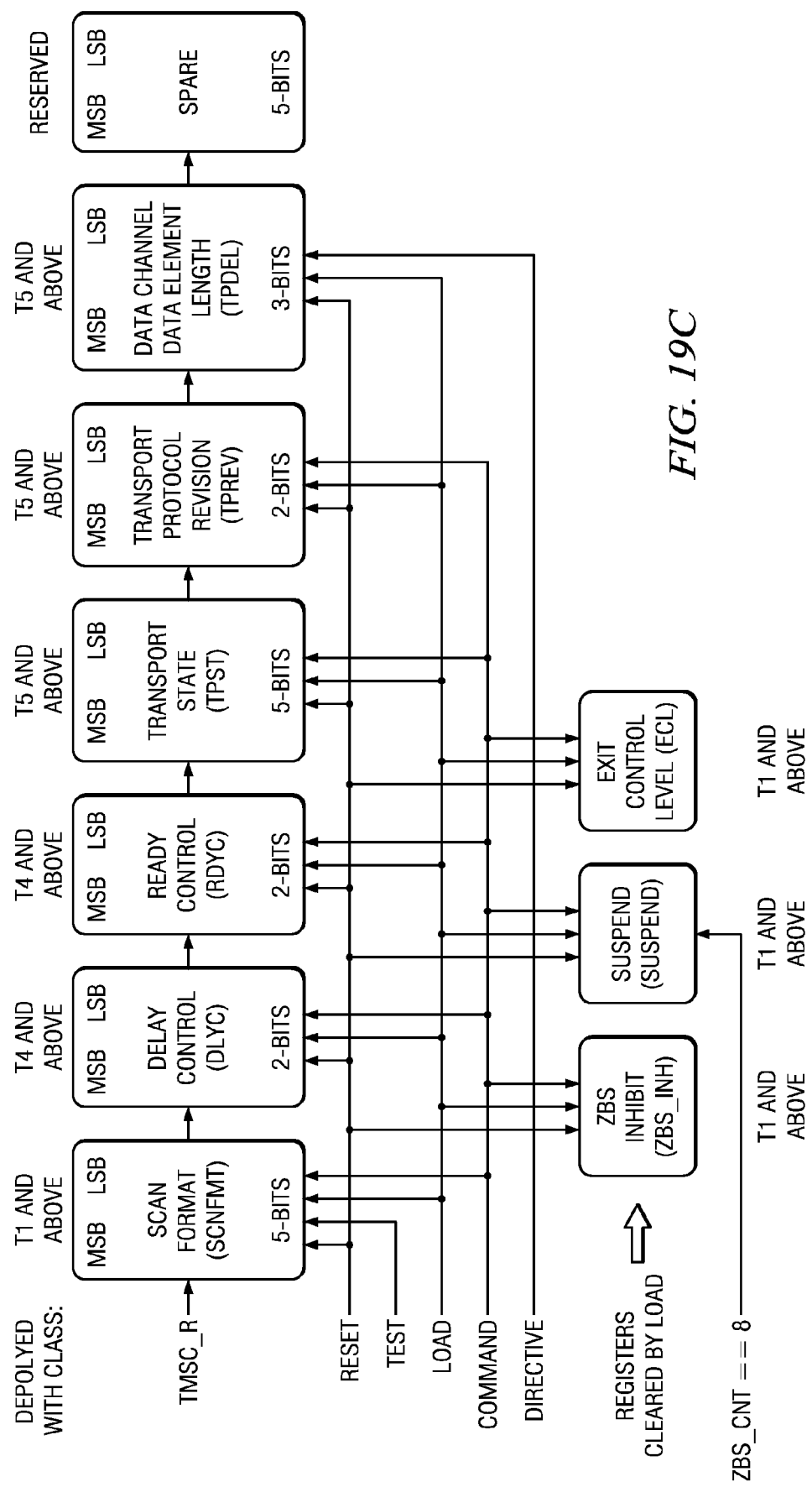
FIG. 19C is a block diagram of global registers illustrating serial loading of the global registers.

Global registers are loaded with the global register state information serially as shown in FIG. 19C. Signal TMSC_R is a buffered version of the TMSC signal line used within the TAPC for loading registers. When the NGRLD bit in the Extension Code (bit[3]) is a logic 0, the long form of the TAP.7 selection sequence is used. The short form of the TAP.7 selection sequence is used otherwise.

With the long form of the selection sequence, the TAP.7 controller's Global Registers are configured as a shift register as shown in FIG. 19C. The order of the Global Registers in this shift register is determined by the TAP.7 Class where they are first utilized. The Global Registers of a T2 TAP.7 are closest to the shift register input with the registers of incrementing classes following thereafter. Note that these register values are transmitted LSB first, so the MSB of each Global Register that is a segment of the Shift Register is nearest the Shift Register input when the Global Register Load completes.

The DTS transmits the Global Register State information defined in Table 10 with the register values supporting the T5 TAP.7 being transmitted first. With this approach, all Global Register information that is associated with the TAP.7 Classes above the class implemented is merely discarded.

The ZBS Inhibit (ZBSINH), Suspend (SUSPEND), and Exit Control Level (ECL) Registers are set to a logic 0 by the LOAD state and are not part of the shift register. Note that the load of Global Register State overwrites the Scan Format Value.

The loading of global registers is useful to re-establish context after a simple device has been placed in offline mode, for example. For example, a component that has an 1149.1 may be upgraded with a wrapper that performs at least the minimal 1149.7 functionality. The component may not permit access to the internals of its core, so that it may not be feasible to do scan topology training, for example. In this case, loading its global registers under control of the DTS can be used to configure the TAPC.

Directive Processing Within a CP (CBDY0, CBDY1, DIRP) CP Format

The CHK (check) state is used to determine whether the attributes of the TAP.7 protocol required for Online Operation are supported by the TAP.7 controller when this state ends with the CP_END directive. It may also create a TAP.7 controller reset. Its use is invoked when operating by one of the following: 1) Standard Protocol and a value requiring the use of the Advanced Protocol is stored in the Scan Format Register; 2) Advanced Protocol and Command Part Two completes; or 3) Control Protocol and both parts of the selection test within the selection sequence pass. In each of these cases, the CP verifies the TAP.7 controller supports the capability required to operate Online without loss of synchronization.

Figure 20:
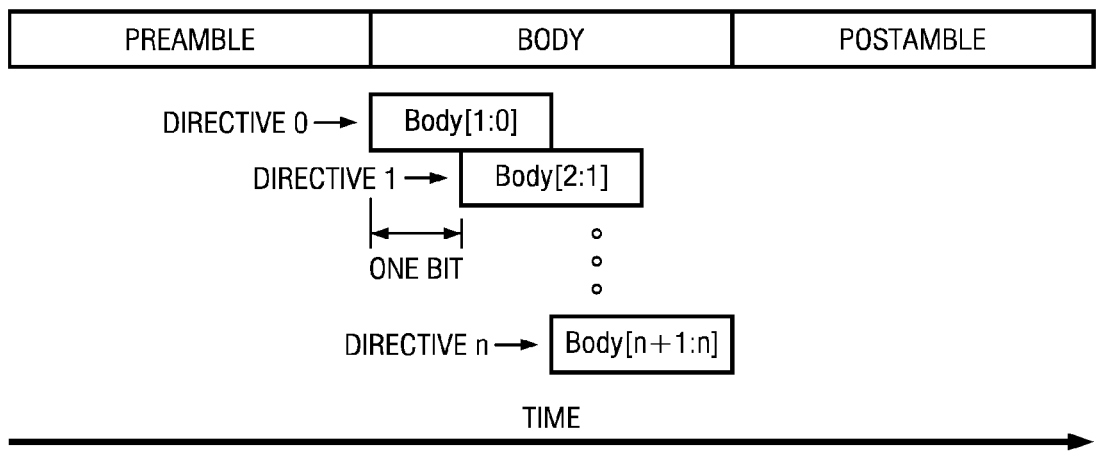
FIG. 20 is a timing diagram illustrating a check packet (CP) directive format.
Figure 21:
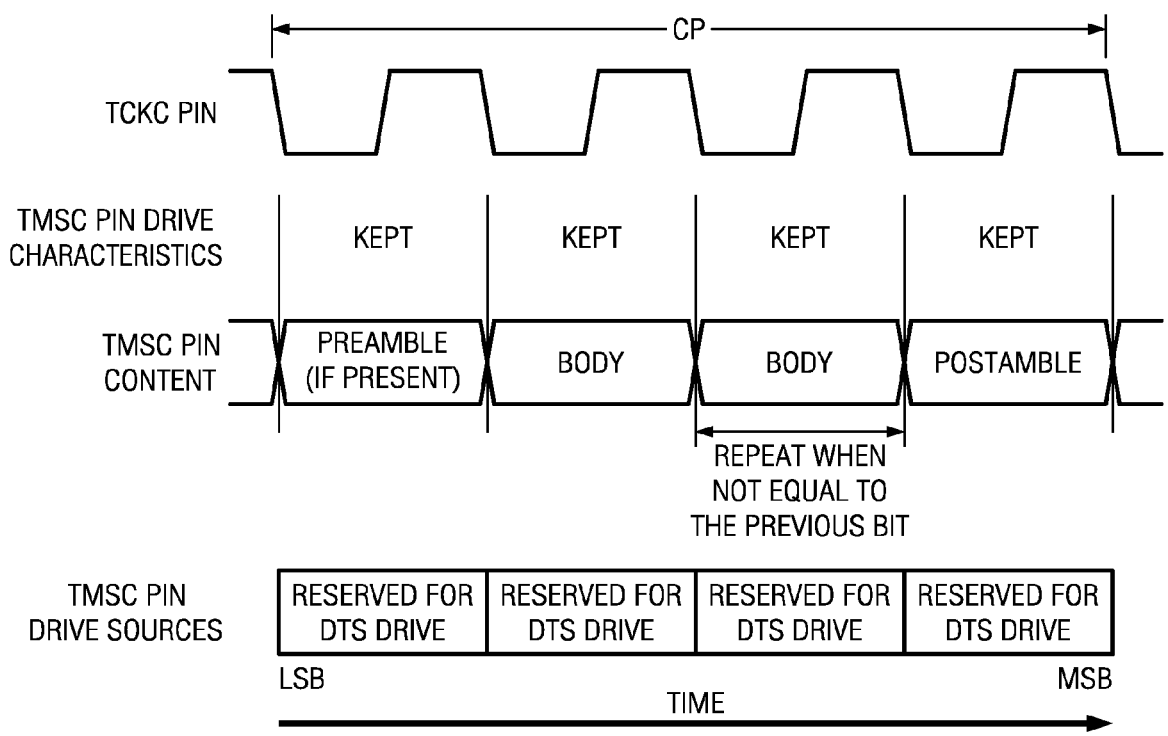
FIG. 21 is a more detailed timing diagram of a CP template.

The Check Packet (CP) format is shown in FIG. 20. FIG. 21 is a more detailed timing diagram of a CP template. When its use is initiated with a selection event, only the Body and Postamble are used. The completion of command part two when either the command specifies the use of the Advanced Protocol or the Advanced Protocol causes its use. In this case, the Preamble, Body, and Postamble are used.

The CP Preamble Element provides a period of time where the transition from the use of the Standard Protocol to the Advanced Protocol may occur. This is helpful to some DTS implementations. The DTS may use this time period to change the TMSC pin drive source or drive characteristics as the TAP.7 controller ignores the value of the Preamble Element. It may be beneficial to set the value the same as the first bit of the body.

The CP Postamble Element provides a period of time where the transition from the use of the Advanced Protocol to the Standard Protocol may occur. The DTS may use this time period to change its drive characteristics or the TMSC pin drive source as the TAP.7 controller ignores the value of the Preamble Element. It may be beneficial for this bit to have the same value as the last bit of the body.

From a conceptual standpoint, the TAP.7 controller detects CP directives by registering the TMSC input for TCKC periods k and k+1. Directive processing begins once two bits of the Body Element are registered. The most recent two bits of the Body Element form a CP directive as shown in FIG. 20, with the most recent TMSC pin value being the MSB of this directive. The CP Body Element is extended one bit with a CP_NOP directive. The CP Postamble Element follows a CP_END or CP_RES directive. A CP_RES directive causes a Type-3 TAP.7 controller reset coincident with the Postamble Element.

A CP directive may initiate one of the following actions: CP_END—end the CP with a transition to BPA; end the CP with a transition to SPA; or continue the CPA state by placing the TAP.7 controller offline; CP_NOP—extend the CP Body by one bit when the TAP.7 controller is offline; and CP_RES—initiate a Type-3 TAP.7 controller reset.

A CP_END directive verifies that the TAP.7 global registers specify the Standard or Advanced Protocol that is supported. A global register is changed by either a command or the LOAD state the CP_END directive checks whether a CPA to SPA state transition would expose the TAP.7 controller to Advanced Protocol traffic that it does not support. If this is the case, the TAP.7 controller is placed offline. The WAIT and CPA states are exited otherwise.

A TAP.7 controller begins processing the CP Preamble Element immediately after any of the following: 1) a selection test that is not followed by a serial load of global registers; 2) a serial load of the global registers; 3) the TMS value associated with the Update-DR TAPC state associated with command part two provided all of the following are true: a) the TAP.7 class is T4 and above, b) the TAP.7 controller command is STFMT, the value to be stored in the SCNFMT register specifies the use of the Advanced Protocol; 4) the last bit of the SP associated with either a Select-DR-Scan or Run-Test/Idle state provided these states immediately follow the Update-DR TAPC state associated with command part two The TAP.7 controller ignores the value of the Preamble and Postamble bits of a CP. Beginning with the second bit of the CP body, the last two bits of the body are be used as a CP directive causing the action shown in Table 16. The most recently received bit of the bit of the CP body is considered the MSB of the CP directives shown in Table 20.

TABLE 20

CP directives

CP body last two bits

| Mnemonic | MSB LSB | Action |
|---|---|---|
| CP_END | 00b | The CP body element is complete, Postamble Element follows |
| CP_NOP | 01b, 10b | The CP body element is extended one bit period. |
| CP_RES | 11b | The CP body element is complete, Postamble Element follows, a Type-3 TAP.7 controller reset occurs coincident with the Postamble Element. |

Offline at Start-Up State (OLS)

The OLS state is activated by Type-0, Type1, Type-2, and Type-3 resets when the start-up option is Offline-at-Start-up. The OLS state presumes that the CLTAPC and embedded TAPCs within the STL have an unknown TAPC state machine state even though the TAP.7 controller's TAPC state is Test-Logic-Reset. This state couples the CLTAPC and moves its TAPC state machine state to Run-Test/Idle via the Test-Logic-Reset State using SYS_TCK and SYS_TMS. The process occurs concurrently with the resynchronization process. It begins when the Reset State Machine reaches the NO_RES state and proceeds at one half the TCKC frequency. This allows the actual TCKC frequency to be higher than the maximum operating frequency of the STL while in the OLS state.

Figure 22:
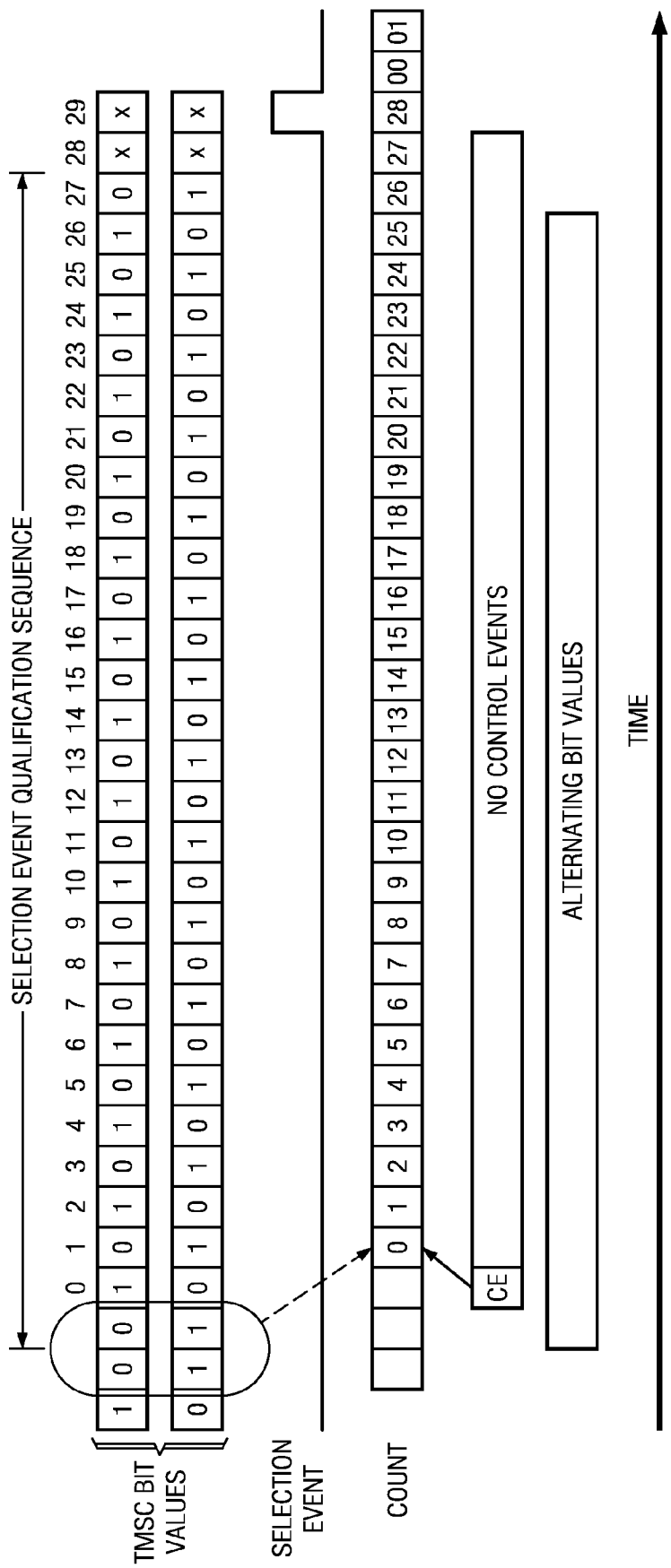
FIG. 22 is a timing diagram illustrating a selection event qualification sequence.

While in the OLS state, selection events are qualified to initiate a selection test when they are preceded by TCK(C) and TMS(C) behavior meeting following criteria (i.e., a qualification sequence): 1) a selection event occurs coincident with bit [n]; 2) each TMS(C) value in the series of 28 values [n−2: n−28] is the inverse of value of the bit preceding it; and 3) an escape sequence event is not detected coincident with bits [n−1: n−27]. Therefore, equal bit values in bit periods [n−2] and [n−1] create a zero count value in bit period [n+1] and a control event in bit period [n] creates a zero count value in bit period [n+1]. A sequence of TMS(C) bits satisfying the criteria is called the OLS Selection Event Qualification Sequence and is shown in FIG. 22.

Figure 23:
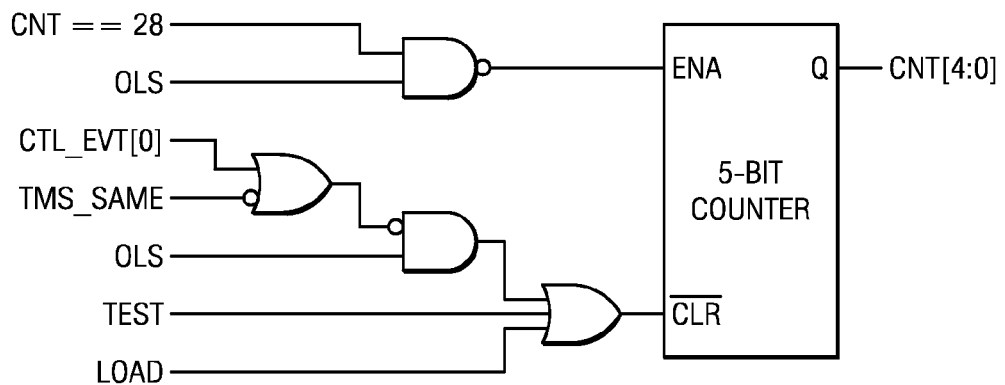
FIG. 23 is a block diagram of a counter supporting the SELT and OLS states.

The CLTAPC state can be initialized to the Run-Test/Idle state coincident with selection event qualification. While in the OLS state, a 5-bit counter illustrated in FIG. 23 records the number of alternating TMS(C) values. The counter is cleared at the beginning of bit period k and any time the TMS(C) values in bit period k−2 and k−3 are the same value. It is also cleared by any control event. It is enabled to count only when the count value is less than 28.

Figure 24:
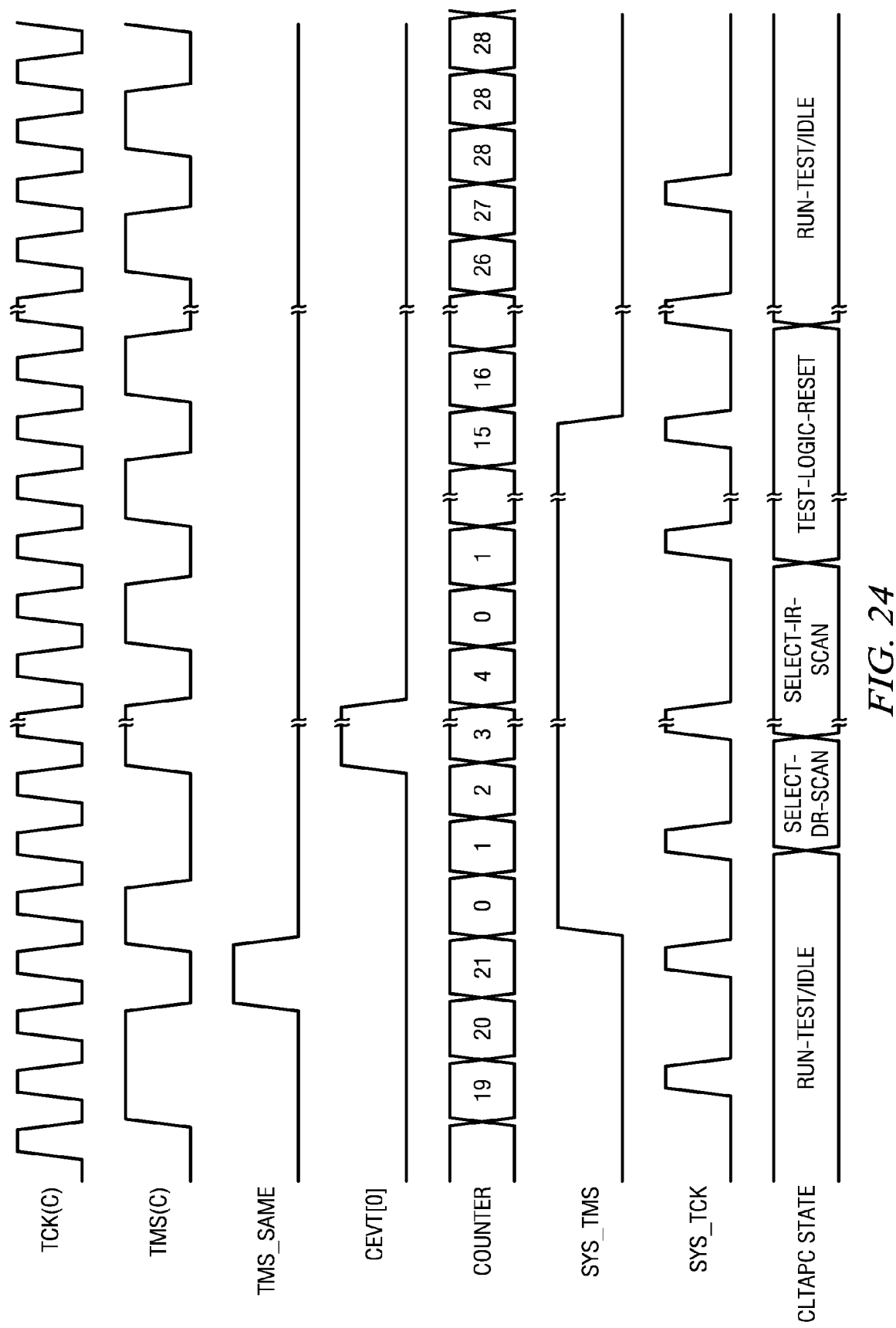
FIG. 24 is a timing diagram illustrating simultaneous selection event qualification and TAPC state initialization.

As shown in FIG. 24, successive data bit values are compared with the TMS_SAME signal. A SYS_TCK is generated for TCK(C) periods where the count value odd (1, 3, . . . etc.). The SYS_TMS value is created with the inverse of counter bit [4]. Each time the counter is cleared, it is assured to generate a minimum of eight SYS_TCKs with SYS_TMS a logic 1. TMS becomes a zero for count values 16 and above. SYS_TCK in no longer generated when the count reaches 28 and is held at this value, as is shown in FIG. 24.

TAP.7 controller Offline-at-Start-up operation moves the CLTAPC and TAP.7 TAPC state machine states to the Run-Test/Idle state using a clock frequency that is a sub-multiple of TCKC frequency. A TAP.7 controller Offline-at-Start-up operation begins a selection test provided that all of the following are true: 1) a selection control event occurs in coincident with bit [n]; 2) a bit value in bits [n−2: n−28] of each bit of the series is the inverse of value of the bit preceding it; and 3) a control event is not detected coincident with bits [n−1: n−27].

Figure 25:
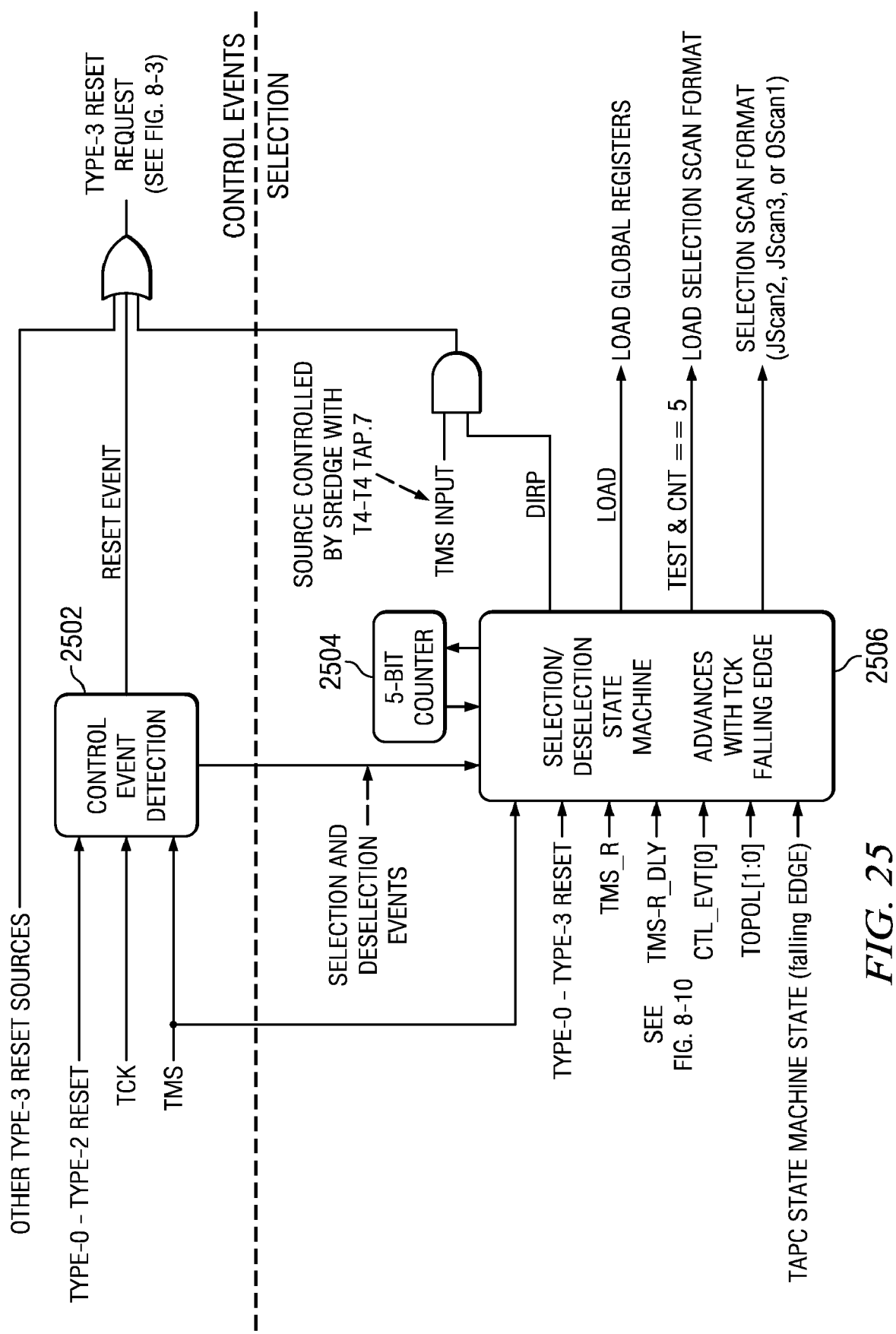
FIG. 25 is an exemplary block diagram of selection/deselection logic.

FIG. 25 is an exemplary block diagram of TAP.7 controller selection/deselection logic. Control event detection logic 2502 performs the event detection operations as described in more detail above. 5-bit counter 2504 operates as described in more detail with respect to FIG. 23. Control state machine 2506 operates as described in more detail with respect to FIG. 15.

Figure 26:
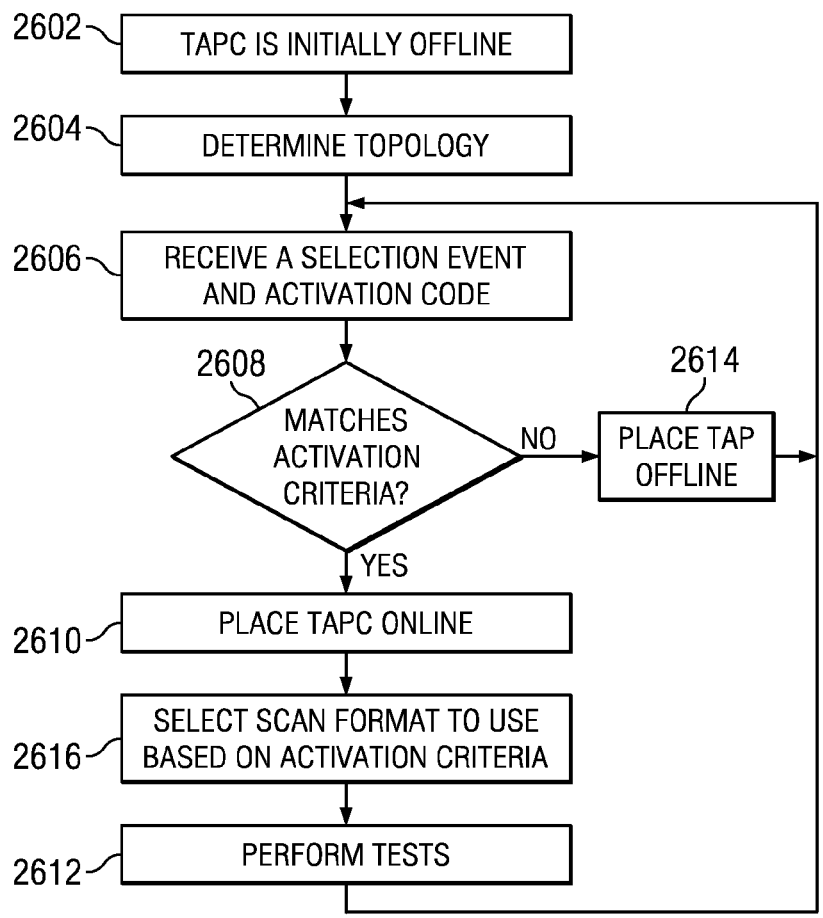
FIG. 26 is a flow diagram illustrating automatic scan format selection based on TAP scan topology selection.

FIG. 26 is a flow diagram illustrating automatic scan format selection based on TAP scan topology selection. Within a system that has several TAPCs, the TAPCs may be connected in different topologies, as discussed with reference to FIGS. 1-8. When the system is first turned on, the TAPCs are reset and initially offline 2602. As described with respect to FIGS. 9-10, each TAPC determines 2604 the topology of its interface connections and saves it in the topology register for later use as a selection criteria.

As described in more detail with regard to FIGS. 11-17, a selection event and activation code is received 2606 by each controller from the DTS. The activation code specifies a specific topology, such as Series, Star-4, Star-2 or All, as defined in Table 8. When the selection criteria specified by the activation code matches 2608 the saved topology 2604 of the TAPC (or a hardcoded value in T0-T2 TAP.7s) or is ALL, then the TAPC is placed online 2610.

Based on the activation code, the TAPC selects 2616 a scan format to use, as described in more detail above, from a number of formats that it is capable of using, such as: JScan2, JScan3, and OScan1. While the TAPC is online, it may perform various tests 2612 using associated system test logic as directed by the DTC and described in more detail above.

When the selection criteria specified by the activation code does not match 2608 the saved topology 2604, then the TAPC is placed offline 2614.

As described in more detail above, one type of selection event is transmitted on the TMSC signal line as a series of edge transitions while the TCK(C) line is held steady. The TMSC signal line connects to all of the TAPCs in a hierarchical layer in a parallel manner so that all of the TAPCs see the selection event in parallel.

As described in more detail above with regard to FIGS. 21-25, when the TAPC is in an initial offline state, the DTC may send a qualification sequence immediately prior to the selection event by toggling the mode select line signal line for a number of times. In some embodiments, the TMSC line is toggled 28 times to form a qualification sequence.

Other Embodiments

While the invention has been described with reference to illustrative embodiments, this description is not intended to be construed in a limiting sense. Various other embodiments of the invention will be apparent to persons skilled in the art upon reference to this description.

Although the embodiments of the invention find particular application to systems using Digital Signal Processors (DSPs), implemented, for example, in an Application Specific Integrated Circuit (ASIC), other embodiment may find application to other types of systems, which may have another type of processors. Another embodiment may also be a system that does not include a processor. An ASIC that embodies the invention may contain one or more megacells which each include custom designed functional circuits combined with pre-designed functional circuits provided by a design library, wherein some or all of the megacells include a test access port.

An embodiment of the invention may be a substrate to which is attached multiple chips that have individual test access ports, commonly referred to multi-chip modules. An embodiment may include stacked die devices that have individual test access ports. Another embodiment may be a substrate, such as a printed circuit board, to which is attached multiple chips that have individual test access ports.

While specific examples and illustrations have been presented herein for illustrative purposes, other embodiments may implement only portions of what is illustrated herein. Other embodiments may concepts discussed herein in various manners, such as state machine logic control flow logic, synchronous logic, asynchronous logic, various types of logic and transistor implementations, etc.

An embodiment of the invention may include a system with a processor coupled to a computer readable medium in which a software program is stored that contains instructions that when executed by the processor perform the functions of modules and circuits described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor.

While embodiments of the invention have been described in an IEEE 1149.7 environment, other embodiments of the invention may be used in test or control applications that are not 1EEE 1149. x compliant.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A method for specifying a signaling protocol to be used by a controller comprised in a plurality of controllers connected with shared signaling, the method comprising:
    selecting the controller in the plurality of controllers based on selection criteria received by the controller; and
    specifying the signaling protocol based on the received selection criteria.

2. The method of claim 1, further comprising:
    receiving a selection event and the selection criteria from a signal line at each of the plurality of controllers, wherein the plurality of controllers are connected in parallel to a signal line; and
    placing the controller online only when the received selection criteria matches selection criteria of the controller.

3. The method of claim 2, wherein the selection event and the selection criteria are transmitted together serially on the signal line.

4. The method of claim 2, wherein the signal line connects test mode select pins of the plurality of controllers.

5. The method of claim 2, wherein the signal line connects test mode select pins of the plurality of controllers, wherein some of the controllers are test controllers and some of the controllers are another controller type.

6. The method of claim 2, wherein the signal line connects at least one control pin of the plurality of controllers, none of which are test controllers.

7. The method of claim 2, wherein receiving a selection event comprises receiving a bit pattern that is a qualification sequence permitting the initiation of a selection sequence by the selection event at each of the plurality of controllers.

8. The method of claim 2, wherein receiving a selection event comprises receiving a bit pattern that is a selection event, wherein the selection event initiates a selection sequence at each of the plurality of controllers.

9. The method of claim 1, wherein the received selection criteria specifies a scan topology type and the selection criteria of the controller specifies a scan topology type of the controller.

10. The method of claim 2, wherein receiving a selection event comprises:
    receiving a clock signal that transitions between a first logic state and a second logic state;
    receiving a data signal that contains data synchronized with the clock signal;

detecting two or more edge transitions on the data signal while the clock signal is held at the first logic state;
counting a number of the edge transitions on the data signal while the clock signal is held at the first logic state; and
determining a control event based on the number of edge transitions on the data signal that have been counted at the time the clock signal transitions to the second logic state.

11. The method of claim 10, wherein the edge transitions occur while the clock signal is held at a logic state for an extended period of time.

12. The method of claim 10, wherein the edge transitions occur while the clock signal continues to operate in a constant periodic manner.

13. A method for selecting a protocol format for a controller comprised in a plurality of controllers connected in a scan topology in a target system, the method comprising:
receiving a qualification bit sequence from a signal line at each of the plurality of controllers, wherein the plurality of controllers are connected in parallel to the signal line;
receiving a control event from the signal line at each of the plurality of controllers;
receiving an online selection criteria from the signal line at each of the plurality of controllers when the control event is a selection event;
entering an offline state by a controller of the plurality of controllers when the selection criteria does not match selection criteria of the controller;
entering an online state by the controller when the online selection criteria matches the selection criteria of the controller; and
selecting the protocol format from a plurality of protocol formats supported by the controller based on the online selection criteria received by the controller, wherein the protocol format specifies a signaling protocol used for transfers of control and/or data information.

14. The method of 13, wherein receiving a control event occurs while a clock signal line is held high, wherein the plurality of test controllers are connected in parallel to the clock signal line, and wherein receiving the online selection criteria occurs while the clock signal is toggled in a synchronous manner.

15. The method of 13, wherein the signal line connects test mode select pins of the plurality of controllers and the clock signal line connects clock pins of the plurality of controllers.

16. The method of 14 wherein the signal line connects test mode select pins of test controllers in the plurality of controllers and a control or data pin of other types of controllers in the plurality of controllers and the clock signal line connects clock pins of the plurality of controllers.

17. The method of 14, wherein the signal line connects control or data pins of the plurality of test controllers and the clock signal line connects clock pins of the plurality of controllers.

18. A method for selecting a protocol format for a controller comprised in a plurality of controllers connected in a scan topology in a target system, the method comprising:
receiving a bit sequence constituting a control event from a signal line at each of the plurality of controllers, wherein the plurality of controllers are connected in parallel to the signal line;
receiving selection criteria from the signal line at each of the plurality of controllers when the control event is a selection event;
entering an offline state by a controller of the plurality of test controllers when the received selection criteria does not match selection criteria of the controller;
entering an online state by the controller when the received selection criteria matches the selection criteria of the controller; and
selecting the protocol format from a plurality of protocol formats supported by the controller based on the received selection criteria, wherein the protocol format specifies a signaling protocol used for transfers of control and/or data information.

19. A digital system, comprising:
at least one functional component with a controller, the controller comprising:
a clock input and a control input configured to receive signals from a control system;
a controller scan path having one or more bits, the controller scan path connected to a data input and a data output, wherein the data input and the data output are configured to be coupled to a scan path of a scan topology;
a topology register configured to store a topology type for the controller, and
control logic connected to the topology register, the control logic configured to detect a selection event and selection criteria received on the data input, and further configured to use a scan format of a plurality of scan formats supported by the controller based on the received selection criteria when the received selection criteria matches the selection criteria of the controller, wherein the scan format specifies a signaling protocol.

20. The digital system of claim 19, wherein the control logic is configured to select a series scan format when the data input and data output are coupled in series with the topology scan path, to select a four-wire format when the data input and data output are connected in parallel with the topology scan path, and to select a two-wire format when the data input and data output are not connected to the topology scan path.

21. The digital system of claim 19, wherein the selection event and the selection criteria are received together serially.

22. The digital system of claim 19, wherein the control logic is further configured to receive and detect a sequence of bit values creating a selection event.

23. The digital system of claim 19, wherein the control logic is further configured to place the controller in an offline mode when the received selection criteria does not match the selection criteria, and to place the controller in an online mode when the received selection criteria matches the selection criteria.

24. The system of claim 19, wherein the control logic is further configured to cause the controller to operate as a series connected device when the data input and data output are coupled in series with the topology scan path, to operate as a four-wire parallel connected device when the data input and data output are connected in parallel with the topology scan path, and to operate as a two-wire parallel connected device when the data input and data output are not connected to the topology scan path.

25. The system of claim 19, wherein the control logic is further configured to cause the controller to operate as a series connected device independent of the connectivity or existence of the data input and data output signals.

26. A digital system, comprising:
at least one functional component with a controller, the controller comprising:
a clock signal and a control signal that may be configured to receive test or debug information from a system under test;
a serial path having one or more bits, the serial path connected to the control signal;
controller selection criteria, and control logic coupled to the controller selection criteria, the control logic configured to detect a selection event and selection criteria received on the control signal and to configure the controller for operation using a protocol selected based on the received selection criteria when the controller is selected.

27. The digital system of claim 26, wherein the selection event and the selection criteria are received together serially.

28. The digital system of claim 26, wherein the control logic is further configured to receive and detect a sequence of bit values that qualify the initiation of a selection sequence by the selection event.

29. The digital system of claim 26, wherein the control logic is further configured to place the controller in an offline mode when the received selection criteria does not match the controller selection criteria, and to place the controller in an online mode when the received selection criteria matches the controller selection criteria.

* * * * *